(12) United States Patent
Shimizu et al.

(10) Patent No.: US 7,082,152 B2
(45) Date of Patent: Jul. 25, 2006

(54) SEMICONDUCTOR LASER APPARATUS, SEMICONDUCTOR LASER MODULE, OPTICAL FIBER AMPLIFIER AND SEMICONDUCTOR LASER USAGE DETERMINING METHOD

(75) Inventors: Hiroshi Shimizu, Tokyo (JP); Junji Yoshida, Tokyo (JP); Naoki Tsukiji, Tokyo (JP); Yutaka Ohki, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 344 days.

(21) Appl. No.: 10/375,038

(22) Filed: Feb. 28, 2003

(65) Prior Publication Data

US 2004/0080811 A1    Apr. 29, 2004

Related U.S. Application Data

(60) Provisional application No. 60/363,086, filed on Mar. 12, 2002.

(30) Foreign Application Priority Data

Mar. 1, 2002    (JP) ............................. 2002-056561

(51) Int. Cl.
   *H01S 3/08*    (2006.01)

(52) U.S. Cl. ............................ 372/102; 372/98; 372/99

(58) Field of Classification Search ................. 372/102
   See application file for complete search history.

(56) References Cited

U.S. PATENT DOCUMENTS

| 6,384,963 | B1 | 5/2002 | Ackerman et al. ........... 359/334 |
| 2002/0075914 | A1* | 6/2002 | Koyanagi ..................... 372/36 |
| 2002/0118715 | A1* | 8/2002 | Kimura et al. ................ 372/36 |

OTHER PUBLICATIONS

Measurement Methods for Stimulated Raman and Brillouin Scattering in Optical Fibres, R. Billington NPL Report COEM Jun., 31, 1999.
U.S. Appl. No. 10/935,286, Filed Sep. 8, 2004, Emori et al.

* cited by examiner

*Primary Examiner*—Armando Rodriguez
(74) *Attorney, Agent, or Firm*—Oblon, Spivak, McClelland, Maier & Neustadt, P.C.

(57) ABSTRACT

An n-Inp buffer layer, a GRIN-SCH-MQW active layer, and a p-InP spacer layer are laminated on an n-InP substrate. A p-InP blocking layer and an n-InP blocking layer are provided to be adjacent to an upper region of the n-InP buffer layer, the GRIN-SCH-MQW active layer and the p-InP spacer layer. A p-InP cladding layer, a p-GaInAsP contact layer, and a p-side electrode are laminated on the p-InP spacer layer and the n-InP blocking layer, and an n-side electrode is arranged on a rear surface of the n-InP substrate. A diffraction grating that selects light having the number of oscillation longitudinal modes of not less than 10, more preferably not less than 18, oscillation longitudinal modes the difference values of which in optical intensity from the oscillation longitudinal mode having the highest optical intensity are not more than 10 dB, is arranged in the p-InP spacer layer.

3 Claims, 28 Drawing Sheets

- 10 p-SIDE ELECTRODE
- 7 p-GaInAsP CONTACT LAYER
- 6 p-InP CLADDING LAYER
- 9 n-InP BLOCKING LAYER
- 8 p-InP BLOCKING LAYER
- 2 n-InP BUFFER LAYER
- 1 n-InP SUBSTRATE
- 11 n-SIDE ELECTRODE
- 3 GRIN-SCH-MQW ACTIVE LAYER
- 2 n-InP BUFFER LAYER
- 13 DIFFRACTION GRATING
- 4 p-InP SPACER LAYER

REFLECTING SIDE REFLECTION FILM 14

EMITTING SIDE REFLECTION FILM 15

$3200 \mu m \geq L \geq 800 \mu m$

US 7,082,152 B2

SEMICONDUCTOR LASER APPARATUS, SEMICONDUCTOR LASER MODULE, OPTICAL FIBER AMPLIFIER AND SEMICONDUCTOR LASER USAGE DETERMINING METHOD

BACKGROUND OF THE INVENTION

1) Field of the Invention

The present invention relates to a semiconductor laser apparatus, a semiconductor laser module and an optical fiber amplifier using the semiconductor laser apparatus, and a usage determining method for a semiconductor laser apparatus.

2) Description of the Related Art

Recently, as optical communications represented by the Internet develop, the arrangement of an optical fiber amplifier midway along a transmission optical fiber so as to transmit an optical signal over a long distance is widely adapted. The optical fiber amplifier amplifies signal light the intensity of which is decreased in the course of the transmission of the signal thereof in the optical fiber and thereby restores the intensity of the signal light. Specifically, an amplification system using an Erbium doped fiber (to be referred to as "EDF" hereinafter), a system using Raman amplification and the like are proposed and put to practical use. In addition, in order that signal light is amplified midway along a transmission submarine optical fiber, a so-called remote pump type optical fiber amplifier is proposed. The remote pump type optical fiber amplifier has a pump source is installed on land and transmits pump light from the pump source to the EDF via a pump light transmission optical fiber. The remote pump type optical fiber amplifier can also easily maintain by installing the pump source on land.

An increase in the amplification gain of an optical fiber amplifier leads to a decrease in the number of optical fiber amplifiers to be arranged and thus signal light can be transmitted at lower cost. Each optical fiber amplifier includes a semiconductor laser apparatus that functions as a pump source. Light amplification gain of signal light normally corresponds to the intensity of a laser beam emitted from the semiconductor laser apparatus provided in the optical fiber amplifier. To realize an optical fiber amplifier having high amplification gain, therefore, it is desirable that the semiconductor laser apparatus used as the pump source has high optical power. For this reason, the development of high power semiconductor laser apparatuses is actively underway and semiconductor laser apparatuses that have sufficiently high optical power to each serve as a pump source have been partially realized.

However, as the output of the semiconductor laser apparatus that constitutes the pump source improves, a new problem arises. As explained above, pump light emitted from the pump source is incident on the transmission amplification optical fiber. However, when light having higher intensity than a certain threshold is incident on the optical fiber, stimulated Brillouin scattering occurs. The stimulated Brillouin scattering is a nonlinear optical phenomenon that scattering (reflection) occurs by the interaction of the incident light with an acoustic wave (phonon). It is observed as a phenomenon that the light with frequency about 11 GHz (giga-hertz) lower than the incident light loses energy equivalent to phonon through the scattering and is reflected in opposite direction to the incident light.

According to the optical fiber amplifier using Raman amplification, when the stimulated Brillouin scattering of the pump light occurs, some of the incident pump light is reflected backward and does not contribute to the generation of Raman gain. In addition, there is a probability that this scattered light generates unexpected noise. The decrease of the intensity of the pump light is not so serious when the distance that a pump light travels is short. However, since the optical fiber amplifier using the remote pump requires. With an optical fiber amplifier using the remote pump, the decrease of the intensity of pump light is greater than the light loss of an ordinary optical fiber. As a result, the amplification gain of the amplification optical fiber disadvantageously lowers.

SUMMARY OF THE INVENTION

It is an object of the present invention to realize a high output semiconductor laser apparatus that can suppress the occurrence of stimulated Brillouin scattering, a semiconductor laser module and an optical fiber amplifier using the semiconductor laser apparatus, and to provide a usage determining method for a semiconductor laser apparatus that can suppress the occurrence of stimulated Brillouin scattering.

According to one aspect of the present invention, there is provided a semiconductor laser apparatus comprising: a first reflection film provided on an emission end face of a laser beam; and an active layer formed between the first reflection film and a second reflection film provided on a reflection end face of the laser beam, further comprising a diffraction grating that has a plurality of oscillation longitudinal modes, and that selects light in which the number of oscillation longitudinal modes, the difference values of which in optical intensity from the oscillation longitudinal mode having the highest optical intensity are not more than 10 dB, is determined based on the total intensity of the laser beam and an effective cross section of the optical fiber when the laser beam is transmitted using the optical fiber.

According to another aspect of the present invention, there is provided a semiconductor laser apparatus comprising: a first reflecting film provided on an emission end face of a laser beam; and an active layer formed between the first reflecting film and a second reflecting film provided on a reflection end face of the laser beam, further comprising a diffraction grating that has a plurality of oscillation longitudinal modes and that selects light that has an RMS (Root Mean Square) method-based spectrum width of not less than 0.7 nm at a slice level of −20 dB with respect to oscillation wavelength spectrum formed by the oscillation longitudinal modes.

According to still another aspect of the present invention, there is provided a semiconductor laser apparatus comprising: a first reflecting film provided on an emission end face of a laser beam; and an active layer formed between the first reflecting film and a second reflecting film provided on a reflection end face of the laser beam, further comprising a diffraction grating that selects light having the number of oscillation longitudinal modes, in which when the laser beam is transmitted by using the first optical fiber, a threshold $f(x)$ of optical intensity in which stimulated Brillouin scattering occurs inside the first optical fiber, designating the number of oscillation longitudinal modes, the difference values of which in optical intensity from the oscillation longitudinal mode having the highest optical intensity are not more than 10 dB, as a variable $x$; a value $g(x)$ obtained by dividing the highest optical intensity of the oscillation longitudinal modes by a sum of optical intensity of all oscillation longitudinal modes, the difference values of which in optical intensity from the oscillation longitudinal mode having the highest optical intensity are not more than 10 dB, designating the number of the oscillation longitudinal modes as a variable x; and a sum $P_{total}$ of the optical intensity of all oscillation longitudinal modes, the difference values of which from the oscillation longitudinal mode having the highest optical intensity are not more than 10 dB in the laser beam at the time of optical transmission, satisfies the relationship of $f(x) \geq g(x) \times P_{total}$.

According to still another aspect of the present invention, a semiconductor laser module comprises the semiconductor laser apparatus, an optical fiber that wave-guides a laser beam emitted from the semiconductor laser apparatus to the outside, and an optical coupling lens system that optically couples the semiconductor laser apparatus to the optical fiber.

According to still another aspect of the present invention, a optical fiber amplifier comprises: an excitation light source that comprises the semiconductor laser apparatus or the semiconductor laser module; an optical fiber that transmits signal light; an amplification optical fiber connected to the optical fiber; a coupler that causes exciting light emitted from the pumping source to be incident on the amplification optical fiber; and an exciting light transmission optical fiber that connects the pumping source to the coupler.

According to still another aspect of the present invention, there is provided a method of sorting a semiconductor laser apparatus that comprises a diffraction grating that selects light having a plurality of oscillation longitudinal modes, the method comprising: a mode number measurement step of measuring the number of oscillation longitudinal modes, the difference values of which in optical intensity from the oscillation longitudinal mode having the highest optical intensity are not more than 10 dB in a design temperature range and a design injection current range; and a sorting step of sorting usage of the semiconductor laser apparatus based on the number of the oscillation longitudinal modes.

According to still another aspect of the present invention, there is provided a method of sorting a semiconductor laser apparatus that comprises a diffraction grating that selects light having a plurality of oscillation longitudinal modes, the method comprising: a spectrum width measurement step of measuring an RMS method-based spectrum width of an oscillation wavelength spectrum at a slice level of −20 dB formed by the oscillation longitudinal modes in a design temperature range and a design injection current range; and a sorting step of sorting usage of the semiconductor laser apparatus based on the spectrum width.

The other objects, features and advantages of the present invention are specifically set forth in or will become apparent from the following detailed descriptions of the invention when read in conjunction with the accompanying drawings.

DETAILED DESCRIPTION

Figure 1:
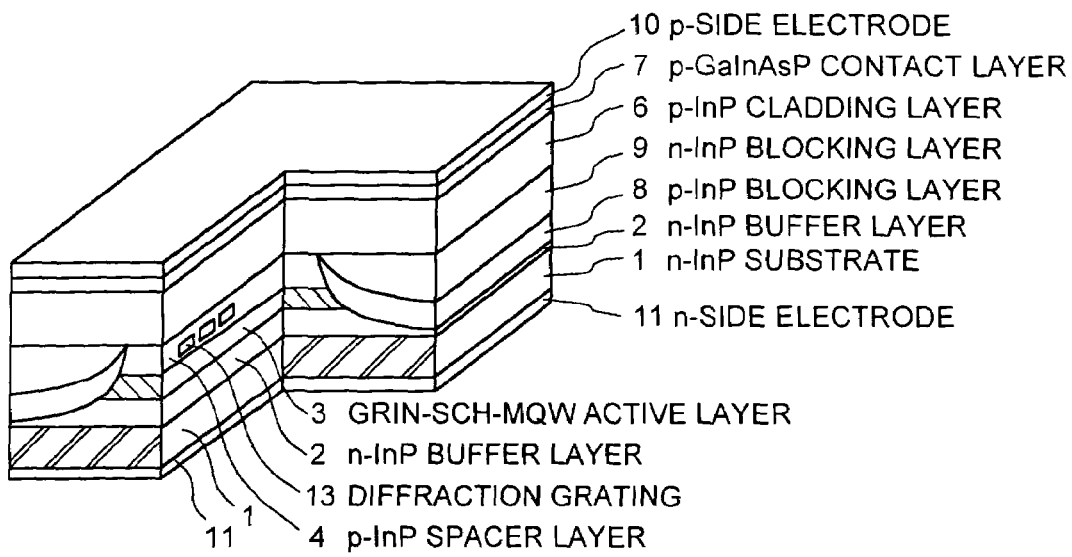
FIG. 1 is a front view that shows the structure of a semiconductor laser apparatus according to a first embodiment.

The present invention relates to a semiconductor laser apparatus comprising a first reflection film provided on an emitting side of the semiconductor laser apparatus, and an active layer formed between the first reflection film and a second reflection film provided on a reflecting side of the semiconductor laser apparatus. More specifically, the present invention relates to a high power semiconductor laser apparatus, a semiconductor laser module and an optical fiber amplifier using the semiconductor laser apparatus, and a usage determining method for a semiconductor laser apparatus that suppresses the occurrence of stimulated Brillouin scattering.

Exemplary embodiments of the semiconductor laser apparatus, the semiconductor laser module and the optical fiber amplifier according to the present invention will be explained hereinafter with reference to the drawings. In the drawings, same or similar sections are denoted by the same or similar reference symbols, respectively. It is noted that the drawings are only typical and the relationship between the thickness and the width of a layer, the thickness rates of respective layers differ from the actual ones. Needless to say, the drawings contain parts that differ from one another in dimensional relationship and rate.

Figure 2:
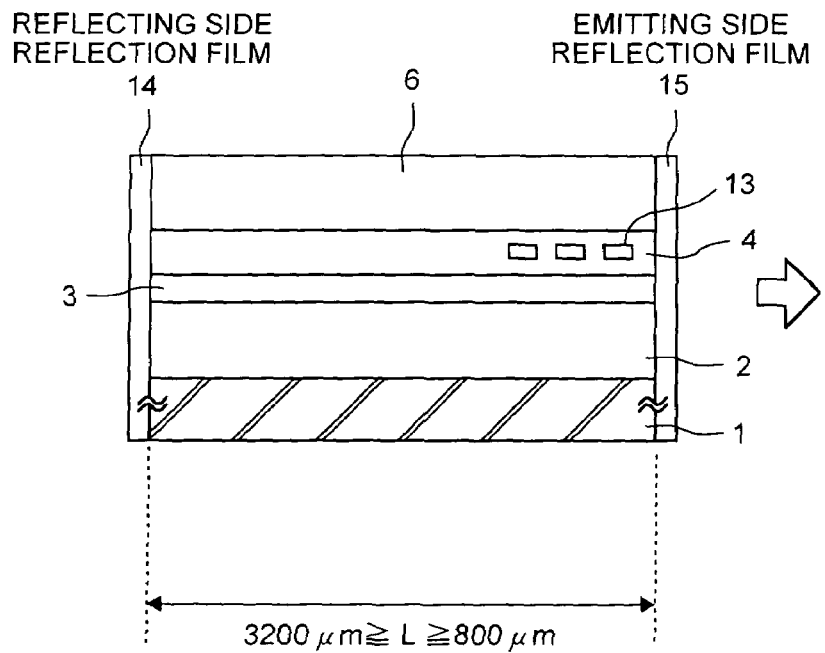
FIG. 2 is a side cross-sectional view that shows the structure of the semiconductor laser apparatus according to the first embodiment.

FIG. 1 is a schematic perspective view of the semiconductor laser apparatus according to a first embodiment of the present invention, and FIG. 2 is a side cross-sectional view of the semiconductor laser apparatus according to the first embodiment.

The structure of the semiconductor laser apparatus according to the first embodiment is explained below while referring to FIG. 1 and FIG. 2. The semiconductor laser apparatus according to the first embodiment is constituted so that an n-InP buffer layer 2, a GRIN-SCH-MQW (Graded Index-Separate Confinement Hetero Structure Multi Quantum Well) active layer 3, and a p-InP spacer layer 4 are sequentially laminated on an n-InP substrate 1. The upper region of the n-InP buffer layer 2, the GRIN-SCH-MQW active layer 3, and the p-InP spacer layer 4 are formed as a mesa stripe structure the longitudinal direction of which is oriented in a light emission direction. A p-InP blocking layer 8 and an n-InP blocking layer 9 are sequentially laminated on the sides on the mesa strip structure. A p-InP cladding layer 6 and a p-GaInAsP contact layer 7 are laminated on the p-InP spacer layer 4 and the n-InP blocking layer 9. A p-side electrode 10 is arranged on the p-GaInAsP contact layer 7 and an n-side electrode 11 is arranged on the rear surface of the n-InP substrate 1. The semiconductor laser apparatus has an emitting side from where laser beam is emitted and a reflecting side. As shown in FIG. 2, an emitting side reflection film 15 is arranged on the emitting side and a reflecting side reflection film 14 is arranged on the reflecting side. A diffraction grating 13 is arranged in the p-InP spacer layer 4.

The n-InP buffer layer 2 functions not only as a buffer layer but also as a cladding layer. Specifically, since the n-InP buffer layer 2 has a lower index of refraction than that of the GRIN-SCH-MQW active layer 3, the layer 2 functions to confine light generated from the GRIN-SCH-MQW active layer 3 in a longitudinal direction.

The GRIN-SCH-MQW active layer 3 has a graded index-separate confinement hetero structure multi quantum well structure and functions to effectively confine carriers injected from the p-side electrode 10 and the n-side electrode 11. The GRIN-SCH-MQW active layer 3 has a plurality of quantum well layers each of which layer exhibits a quantum confinement effect in respective quantum well layers. The quantum confinement effect enables the semiconductor laser according to the first embodiment to ensure high luminous efficiency.

The p-GaInAsP contact layer 7 is provided to form the ohmic-junction between the p-InP cladding layer 6 and the p-side electrode 10. A large quantity of p-type impurities are doped into the p-GaInAsP contact layer 7. Because of the high impurity concentration, ohmic contact between the p-GaInAsP contact layer 7 and the p-side electrode 10 is established.

The p-InP blocking layer 8 and the n-InP blocking layer 9 are provided to constrict injection current therein. In the semiconductor laser apparatus according to the first embodiment, the p-side electrode 10 functions as an anode. Therefore, when voltage is applied, a reverse bias is applied between the n-InP blocking layer 9 and the p-InP blocking layer 8. As a result, no current flows from the n-InP blocking layer 9 to the p-InP blocking layer 8 and current injected from the p-side electrode 10 is constricted and high-density current flows into the GIN-SCH-MQW active layer 3. The high density current leads to an increase in the carrier density of the GRIN-SCH-MQW active layer 3 and luminous efficiency is thereby enhanced.

The reflecting side reflection film 14 has a light reflectance of not less than 80%, preferably not less than 98%. The emitting side reflection film 15 is intended to prevent the reflection of the laser beam at the emitting side. The emitting side reflection film 15, therefore, consists of a low reflectance film structure having a light reflectance of not more than 5%, preferably about 1% of a low reflectance film structure. It is noted, however, that the light reflectance of the emitting side reflection film 15 is optimized according to the length of a resonator and may be other than these values.

The diffraction grating 13 is made of p-GaInAsP Since the diffraction grating 13 is formed out of semiconductor materials different from that of the p-InP spacer layer 4 provided around it, the components with predetermined wavelength, of the light generated from the GRIN-SCH-MQW active layer 3 are reflected by the diffraction grating 13. Because of the presence of this diffraction grating 13, a laser beam emitted from the semiconductor laser apparatus according to the first embodiment has a plurality of oscillation longitudinal modes. The semiconductor laser apparatus according to the first embodiment is constituted so that the number of specific oscillation longitudinal modes is not less than 10, preferably not less than 18. The specific oscillation longitudinal modes have optical intensities, difference values of which from the highest optical intensity of all the oscillation longitudinal modes are not more than 10 dB. Alternatively, the semiconductor laser apparatus in this embodiment is constituted so that the RMS (Root Mean Square) method-based spectrum width of emission wavelength spectrum formed by the oscillation longitudinal modes is not less than 0.7 nm, preferably not less than 1.0 nm. The structure of the diffraction grating and the advantages thereof are explained hereinafter.

The diffraction grating 13 has a film thickness of, for example, 20 nm. The diffraction grating 13 having a length Lg=50 μm (micrometer) is provided from emitting side reflection film 15 toward the reflecting side reflection film 14. The diffraction grating 13 grating period of about 220 nm and selects a laser beam having a central wavelength of 1.48 μm. The multiplication value between coupling coefficient κ and the diffraction grating length Lg of the diffraction grating 13 is set at not more than 0.3, thereby improving the linearity of drive current-light output characteristic and enhancing the stability of light output (see Japanese Patent Application No. 2001-134545). Further, when a resonator length L is 1300 μm and the diffraction grating length Lg is not more than about 300 μm, the semiconductor laser apparatus oscillates in a plurality of oscillation longitudinal modes. It is, therefore, preferable that the diffraction grating length Lg is set at not more than 300 μm. Since the distance between oscillation longitudinal modes changes proportionally to the resonator length L, the diffraction grating length Lg becomes proportional to the value of resonator length L. Namely, to keep the relationship of (diffraction grating length Lg):(resonator length L)=300:1300, a relationship in which a plurality of oscillation longitudinal modes are obtained at the diffraction grating length Lg of not more than 300 μm can be represented by:

$$Lg \times (1300(\mu m)/L) \leq 300(\mu m)$$

In other words, the diffraction grating length Lg is set to maintain the ratio with the resonator length L and to be not more than a value (300/1300) times of the resonator length L (see Japanese Patent Application No. 2001-134545).

The reason that the diffraction grating 13 causes the semiconductor laser apparatus according to the first embodiment to select light having a plurality of oscillation longitudinal modes in the lasing process is explained. It is noted that the emission wavelength $\lambda_o$ of the semiconductor laser apparatus according to the first embodiment is 1100 nm to 1550 nm and the resonator length L thereof is not less than 800 μm and not more than 3200 μm.

Generally, a mode spacing Δλ of the longitudinal modes generated from the resonator of a semiconductor laser apparatus can be expressed as the following equation:

$$\Delta\lambda = \lambda_o^2/(2 \cdot n \cdot L)$$

where n is the effective index of refraction. When the emission wavelength $\lambda_o$ is 1480 μm, the effective index of refraction is 3.5 and the resonator length L is 800 μm, then the longitudinal mode spacing Δλ is about 0.39 nm. When the resonator length is 3200 μm, the longitudinal mode spacing Δλ is about 0.1 nm. In other words, as the resonator length L becomes longer, the mode spacing Δλ becomes narrower, and the conditions for emitting a laser beam having a single oscillation longitudinal mode becomes strict.

On the other hand, the diffraction grating 13 selects longitudinal modes according to the Bragg wavelength thereof. The wavelength selectivity of the diffraction grating 13 is expressed as an emission wavelength spectrum 16 shown in FIG. 3.

Figure 3:
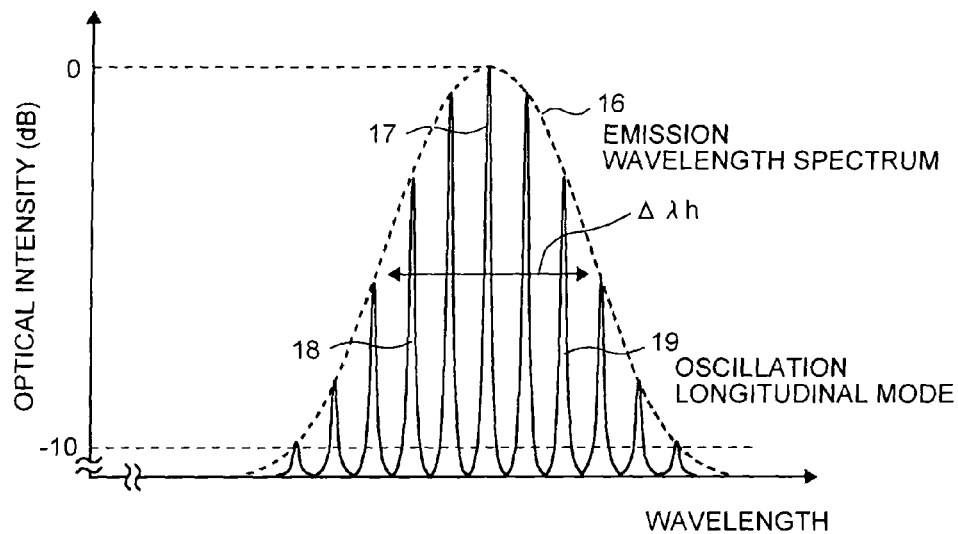
FIG. 3 is a typical diagram that shows the oscillation waveform of the semiconductor laser apparatus according to the first embodiment.

As shown in FIG. 3, in the first embodiment, a plurality of oscillation longitudinal modes are made to be present inside the wavelength selectivity expressed as a half-width Δλh of the emission wavelength spectrum 16, of the semiconductor laser apparatus having the diffraction grating 13. According to a conventional DBR (Distributed Bragg Reflector) semiconductor laser apparatus or DFB (Distributed Feedback) semiconductor laser apparatus, when the resonator length L is set at not less than 800 μm, it is difficult to emit a laser beam in a single oscillation longitudinal mode. Therefore the semiconductor laser apparatus having such a resonator length L cannot be used. According to the semiconductor laser apparatus in this first embodiment, by contrast, by positively setting the resonator length L at not less than 800 μm, many oscillation longitudinal modes are set to fall in the half-width Δλh of the emission wavelength spectrum 16 in the lasing process.

As for the oscillation longitudinal modes selected by the diffraction grating 13, how to determine the number of oscillation longitudinal modes the difference values with which from the highest intensity are not more than 10 dB and the RMS method-based spectrum width $\Delta\lambda_{RMS}$ of the emission wavelength spectrum 16 is explained. The number of oscillation longitudinal modes the difference values with which from the highest intensity are not more than 10 dB and the RMS method-based spectrum width $\Delta\lambda_{RMS}$ of the emission wavelength spectrum 16 are basically, mainly determined depending on the structure of the diffraction grating 13.

As the structure, a structure of changing the diffraction grating length Lg or the coupling coefficient κ of the diffraction grating 13 may be first mentioned. Normally, when the diffraction grating length Lg is smaller, the half-width Δλh of the emission wavelength spectrum is wider and the spectrum width $\Delta\lambda_{RMS}$ is larger. In addition, the number of oscillation longitudinal modes the difference values with which from the highest intensity is not more than 10 dB increases. It is necessary that the product κ·Lg between the coupling coefficient κ and the diffraction grating length Lg is not less than a certain value to select desired oscillation longitudinal modes. However, by decreasing the diffraction grating length Lg under such conditions, it is possible to increase the number of oscillation longitudinal modes and to increase the spectrum width $\Delta\lambda_{RMS}$.

Figure 4:
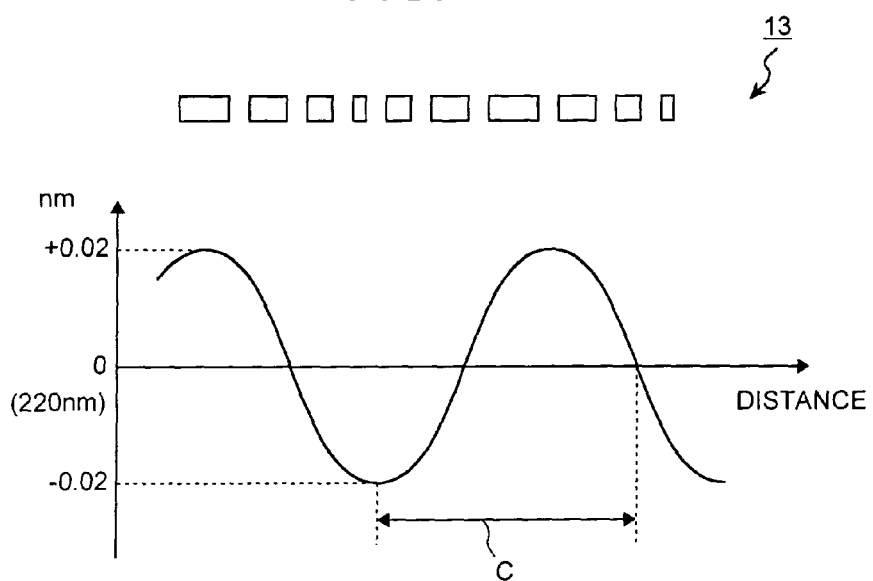
FIG. 4 is a diagram that shows one example of the structure of a diffraction grating according to the first embodiment.
Figure 5:
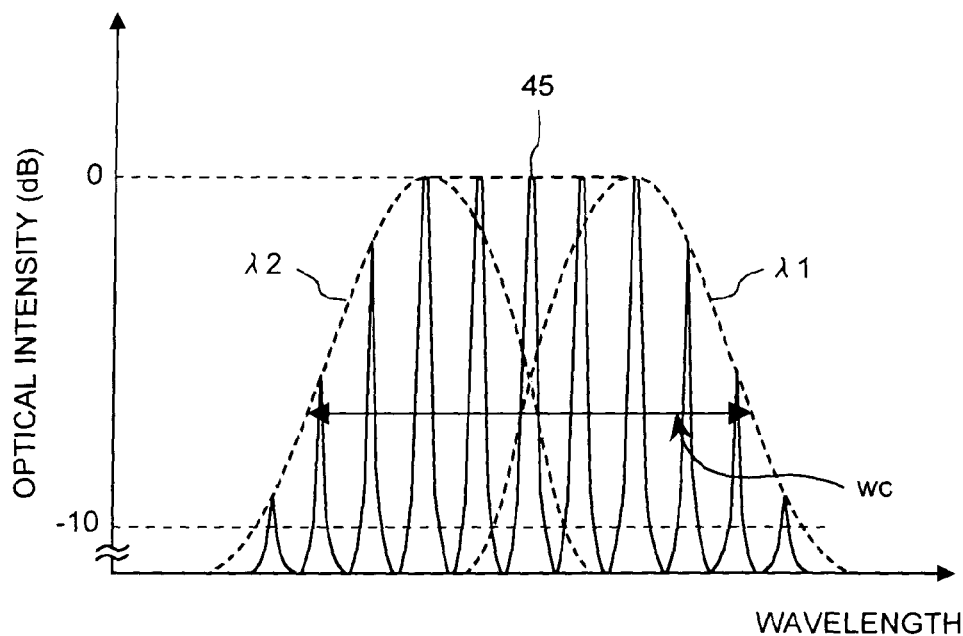
FIG. 5 is a typical diagram that shows the oscillation waveform of the semiconductor laser apparatus according to the first embodiment.

It is also effective to change the grating period of the diffraction grating 13. FIG. 4 shows an example in which a chirped grating having a periodically changed grating period are used as the diffraction grating 13. By doing so, it is possible to generate a fluctuation in the wavelength selectivity of the diffraction grating, to increase the half-width $\Delta\lambda h$ of the emission wavelength spectrum and to thereby increase the spectrum width $\Delta\lambda_{RMS}$. Further, it is made to increase the number of oscillation longitudinal modes, the difference values of which in intensity from an oscillation longitudinal mode having the highest intensity are not more than 10 dB. In other words, as shown in FIG. 5, by increasing the half-width $\Delta\lambda h$ to a half-width wc, the spectrum width $\Delta\lambda_{RMS}$ increases and the number of oscillation longitudinal modes increases.

As shown in FIG. 4, the diffraction grating 13 has a structure in which an average period is 220 nm and a periodic fluctuation (deviation) of ±0.02 nm is repeated in a cycle C. Because of this periodic fluctuation of ±0.02 nm, the reflection band of the diffraction grating 13 has a half-width of about 2 nm, whereby the number of oscillation longitudinal modes the difference values with which from the highest intensity are not more than 10 dB can be increased.

In the example of FIG. 4, the chirped grating the grating period of which is changed in the constant cycle C is used. However, it is not limited thereto and the grating period may be changed randomly between a cycle $\Lambda_1$ (220 nm+0.02 nm) and a cycle $\Lambda_2$ (220 nm−0.02 nm).

Figure 6A:
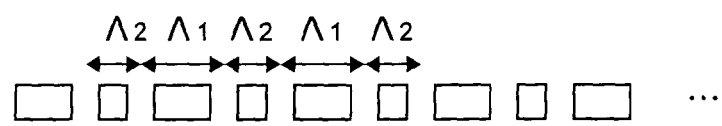
FIGS. 6A to 6C show another example of the structure of a diffraction grating according to the first embodiment.
Figure 6B:
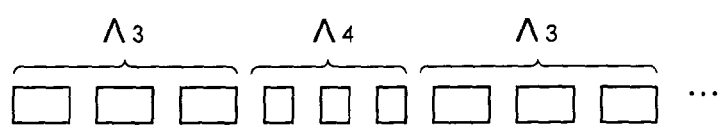
Figure 6C:
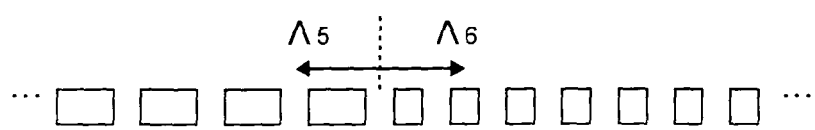

Alternatively, as shown in FIG. 6A, a diffraction grating that alternately repeats the cycle $\Lambda_1$ and the cycle $\Lambda_2$ may be used to cause a periodic fluctuation. Alternatively, as shown in FIG. 6B, a diffraction grating that alternately repeats a plurality of cycles $\Lambda_3$ and a plurality of cycles $\Lambda_4$ may be used to cause a periodic fluctuation. Further, as shown in FIG. 6C, a diffraction grating that has a plurality of continuous cycles $\Lambda_5$ and a plurality of continuous cycles $\Lambda_6$ may be used to cause a periodic fluctuation. Further, it may be arranged to interpolate periods having different discrete values between the cycles $\Lambda_1$, $\Lambda_3$ and $\Lambda_5$ and the cycles $\Lambda_2$, $\Lambda_4$ and $\Lambda_6$, respectively.

Figure 7:
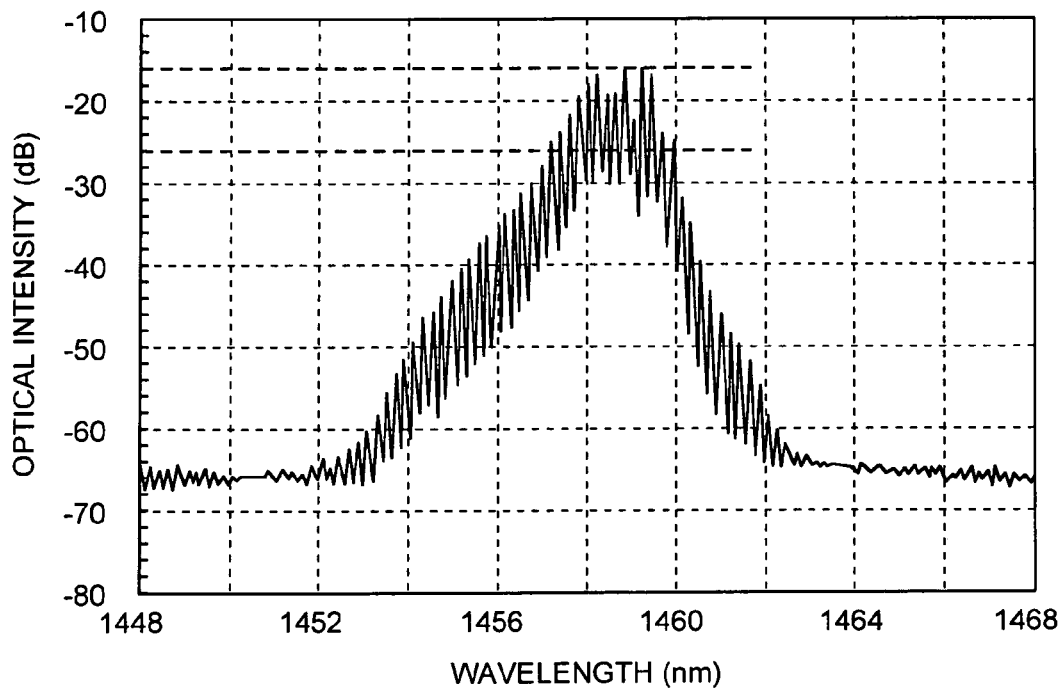
FIG. 7 is a graph that shows the oscillation waveform of the semiconductor laser apparatus that has 14 oscillation longitudinal modes, the difference values of which in optical intensity from an oscillation longitudinal mode having the highest optical intensity are not more than 10 dB.
Figure 8:
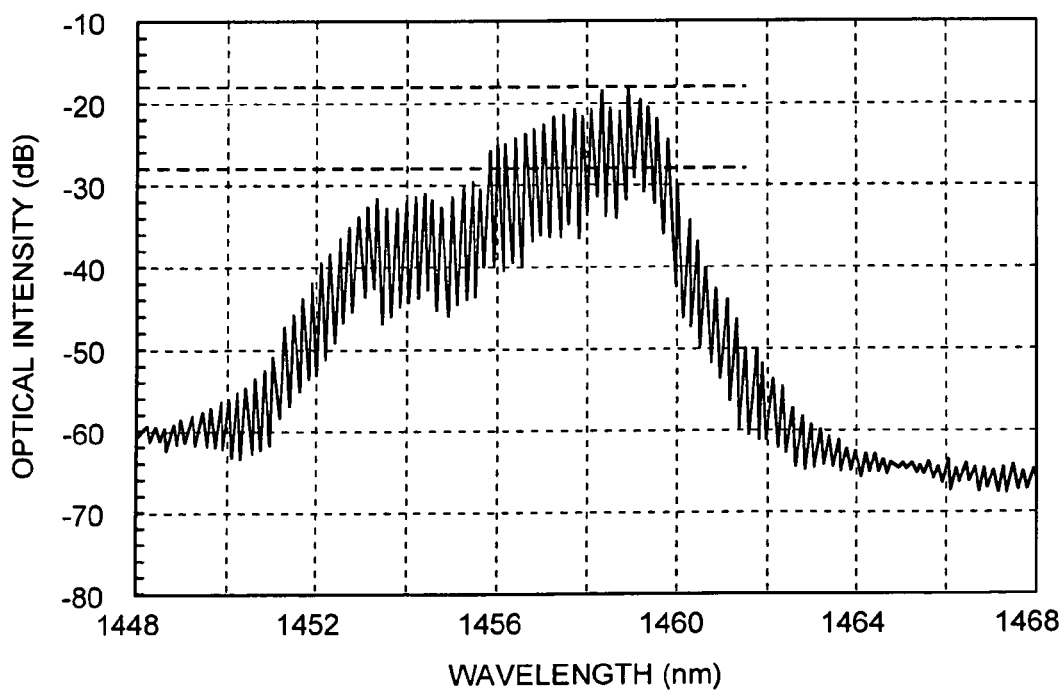
FIG. 8 is a graph that shows the oscillation waveform of the semiconductor laser apparatus that has 20 oscillation longitudinal modes, the difference values of which in optical intensity from an oscillation longitudinal mode having the highest optical intensity are not more than 10 dB.
Figure 9:
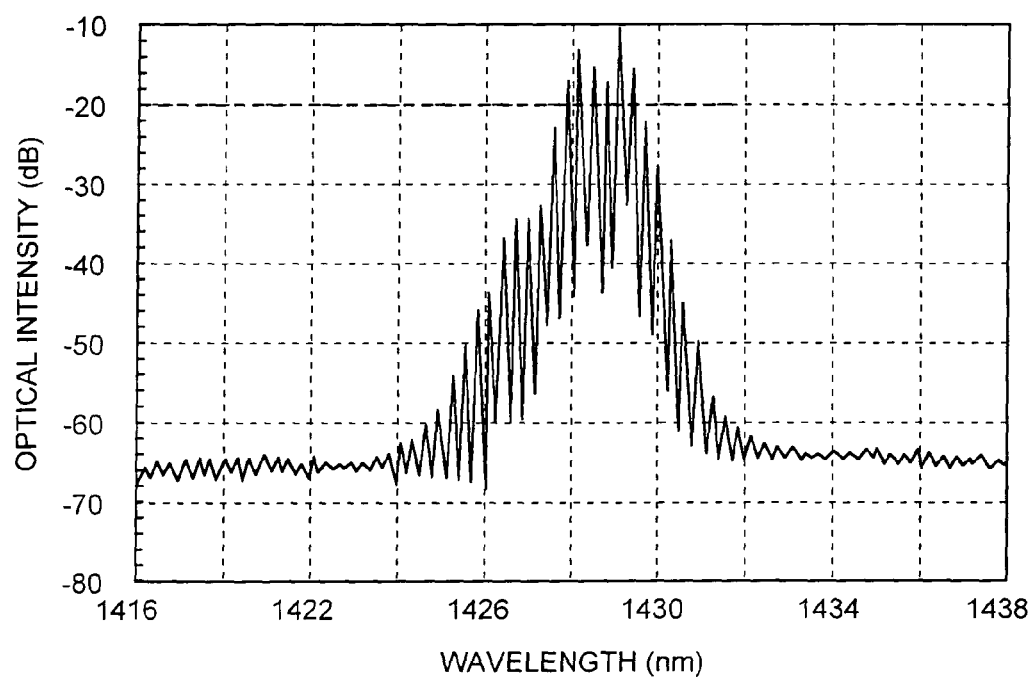
FIG. 9 is a graph that shows the oscillation waveform of the semiconductor laser apparatus that has six oscillation longitudinal modes, the difference values of which in optical intensity from an oscillation longitudinal mode having the highest optical intensity are not more than 10 dB.

By thus adjusting at least the structure of the diffraction grating 13, it is possible to change the number of oscillation longitudinal modes the difference values with which from the highest intensity are not more than 10 dB and the spectrum width $\Delta\lambda_{RMS}$ of the emission wavelength spectrum formed by a plurality of oscillation longitudinal modes according to the RMS method. FIGS. 7 to 9 are graphs each of which shows the oscillation waveform of the semiconductor laser apparatus the number of oscillation longitudinal modes and the spectrum width $\Delta\lambda_{RMS}$ of which are changed by actually adjusting at least the structure of the diffraction grating 13. In FIG. 7, an oscillation longitudinal mode having the highest intensity is present around 1457.5 nm and the optical intensity thereof is about −16 dB. The number of oscillation longitudinal modes the difference values with which from the highest intensity are not more than 10 dB, i.e., the number of oscillation longitudinal modes having optical intensity of not less than about −26 dB in the graph shown in FIG. 7, is 14.

FIG. 8 is a graph that shows the oscillation waveform of the semiconductor laser apparatus having a diffraction grating 13 different in structure from that shown in FIG. 7. An oscillation longitudinal mode having the highest intensity is present around 1459.5 nm and the optical intensity thereof is about −18 dB. The number of oscillation longitudinal modes, the difference values with which from the highest intensity are not more than 10 dB, i.e., the number of oscillation longitudinal modes having optical intensity of not less than about −28 dB in the graph shown in FIG. 8, is 20.

As a comparison example, FIG. 9 shows the oscillation waveform of the semiconductor laser apparatus that has less than ten oscillation longitudinal modes. In FIG. 9, an oscillation longitudinal mode having the highest intensity is present around 1429 nm and the intensity thereof is about −10 dB. The number of oscillation longitudinal modes the difference values with which from the highest intensity are not more than 10 dB, i.e., the number of oscillation longitudinal modes having optical intensity of not less than about −20 dB in the graph shown in FIG. 9, is, therefore, 6.

Figure 10:
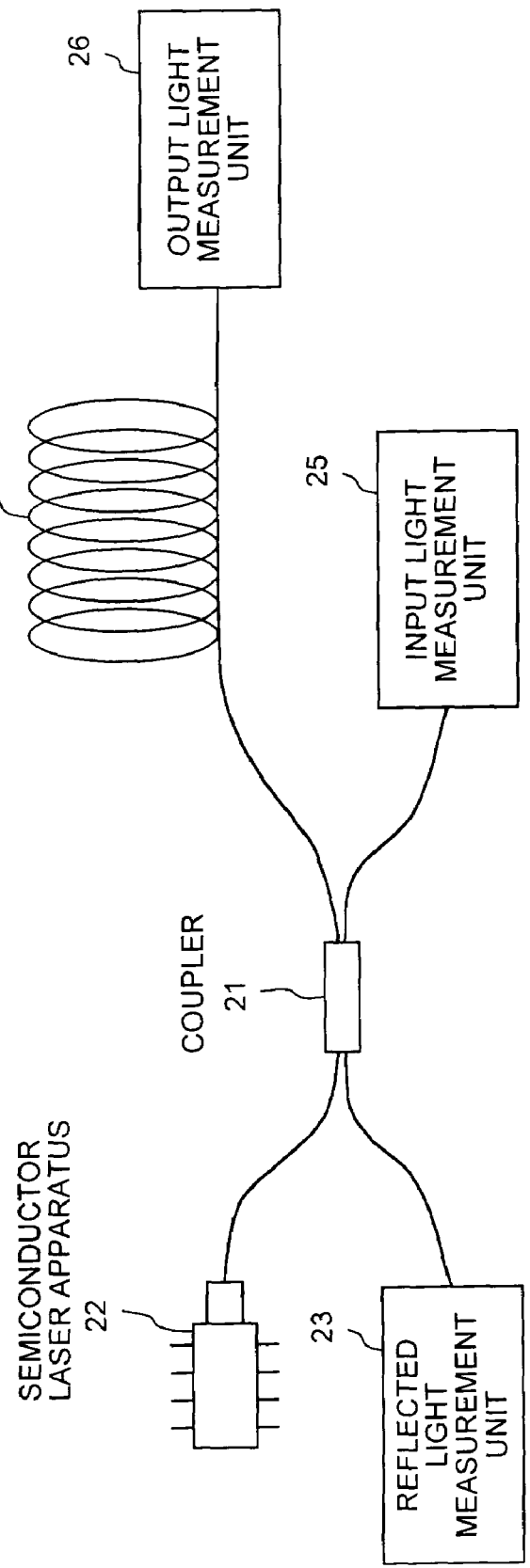
FIG. 10 is a typical diagram that shows the structure of a scattering intensity ratio measurement device.

Conditions for the occurrence of stimulated Brillouin scattering are explained. FIG. 10 is a typical diagram that shows the structure of a measurement device that detects the degree of the occurrence of the stimulated Brillouin scattering. In this measurement device, a semiconductor laser apparatus 22 and a reflected light measurement unit 23 are arranged on one side and a transmission optical fiber 24 and an input light measurement unit 25 are arranged on the other side through a coupler 21. These elements on the one and other side are connected to each other through the coupler 21. The transmission optical fiber 24 is connected to an output light measurement unit 26. As for the transmission optical fiber 24, a DSF (Dispersion Shifted Fiber) is employed, the length of the transmission optical fiber 24 is 55 km (kilometer) and the core diameter thereof is 10 μm.

In the measurement device shown in FIG. 10, a light beam having a certain rate with respect to the intensity of a laser beam output from the semiconductor laser apparatus is incident on the input light measurement unit 25, and a light beam having a certain rate with respect to the intensity of light scattered by and returned from the transmission optical fiber 24 is incident on the reflected light measurement unit 23.

When stimulated Brillouin scattering occurs, the intensity of the light incident on the reflected light measurement unit 23 increases. It is, therefore, possible to determine whether or not stimulated Brillouin scattering occurs by obtaining a ratio of the light which is incident on the transmission optical fiber 24 from the semiconductor laser apparatus 22 to the light scattered by and returned from the transmission optical fiber 24 (hereinafter "scattering intensity ratio"). Normally, when a semiconductor laser apparatus is employed as a pump source for optical communications and a scattering intensity ratio can be suppressed to about −28 dB, then it is considered that scattering is at background level caused by Rayleigh scattering, no stimulated Brillouin scattering occurs and that it can be used as the pump source without causing any problem.

Figure 11:
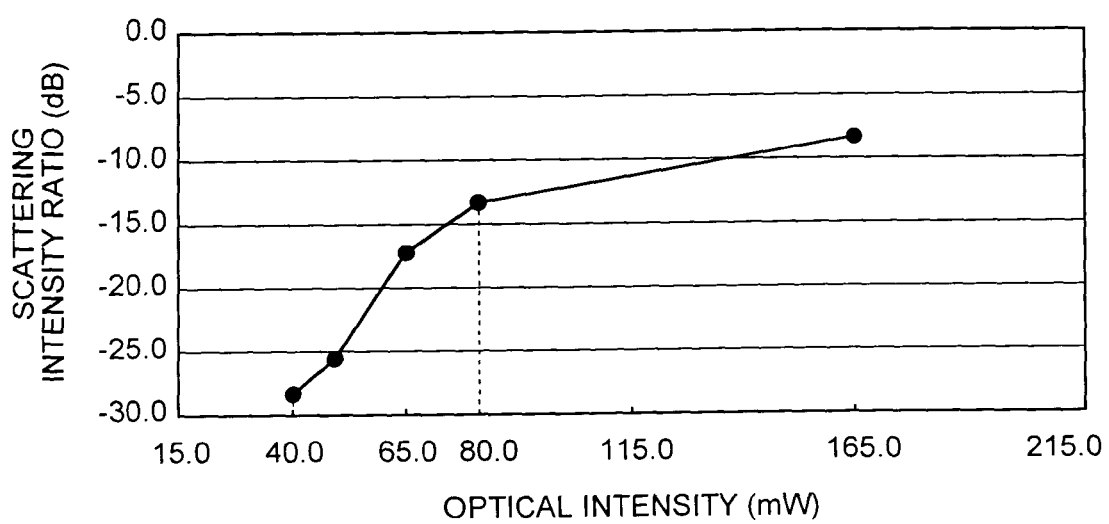
FIG. 11 is a graph that shows the relationship between optical intensity and the scattering intensity ratio.

Even when the scattering intensity ratio is measured as not less than −28 dB by the measurement device shown in FIG. 10, it can be sometimes employed as a pump source. FIG. 11 shows that a scattering intensity ratio for another semiconductor laser apparatus is measured by the measurement device shown in FIG. 10 when the intensity of light incident on the transmission optical fiber 24 is changed. Specifically, an attenuator that functions to change optical intensity is disposed between the semiconductor laser apparatus 22 and the coupler 21, optical intensity is changed by the attenuator while injection current is kept constant and thus a scattering intensity ratio for each optical intensity is measured. Here, it is possible to attenuate light output without changing a spectrum shape such as the number of modes.

In the graph shown in FIG. 11, a decrease in the optical intensity by about 3 dB, i.e., from 80 mW (milli-watt) to 40 mW causes decrease in a scattering intensity ratio from about −13 dB to about −29 dB. In other words, by decreasing light output by about 3 dB, the scattering intensity ratio of about −13 dB for the semiconductor laser apparatus in the measurement device shown in FIG. 10 is suppressed to about −29 dB with which no stimulated Brillouin scattering occurs.

It is known that when a semiconductor laser apparatus is incorporated, as a pump source, into an optical fiber amplifier, the optical intensity of pump light is decreased by several dB before reaching an amplification optical fiber. Normally, a coupler that couples light, an optical isolator that shields return light or the like is disposed between a pump source and an amplification optical fiber in an optical fiber amplifier. The intensity of the pump light is decreased by these optical components. The optical intensity decrease is sometimes as great as not less than 3 dB depending on the structure of the optical fiber amplifier. In such an optical fiber amplifier, it is possible to suppress stimulated Brillouin scattering even with a semiconductor laser apparatus having a scattering intensity ratio of about −13 dB.

From the viewpoint of completely suppressing the stimulated Brillouin scattering, therefore, it is preferable that the scattering intensity ratio is not more than −28 dB. However, it is possible to employ even one having a scattering intensity ratio of about −13 dB as a pump source in an optical fiber amplifier that has optical loss of about 3 dB.

The correlation among the number of oscillation longitudinal modes, the difference values of which in optical intensity from an oscillation longitudinal mode having the highest optical intensity are not more than 10 dB, the RMS method-based spectrum width of the emission wavelength spectrum and the stimulated Brillouin scattering are examined so as to prove that the semiconductor laser apparatus according to the first embodiment can suppress the occurrence of the stimulated Brillouin scattering. Specifically, using the measurement device shown in FIG. 10, scattering intensity ratios are measured for a plurality of semiconductor laser apparatuses.

Figure 12:
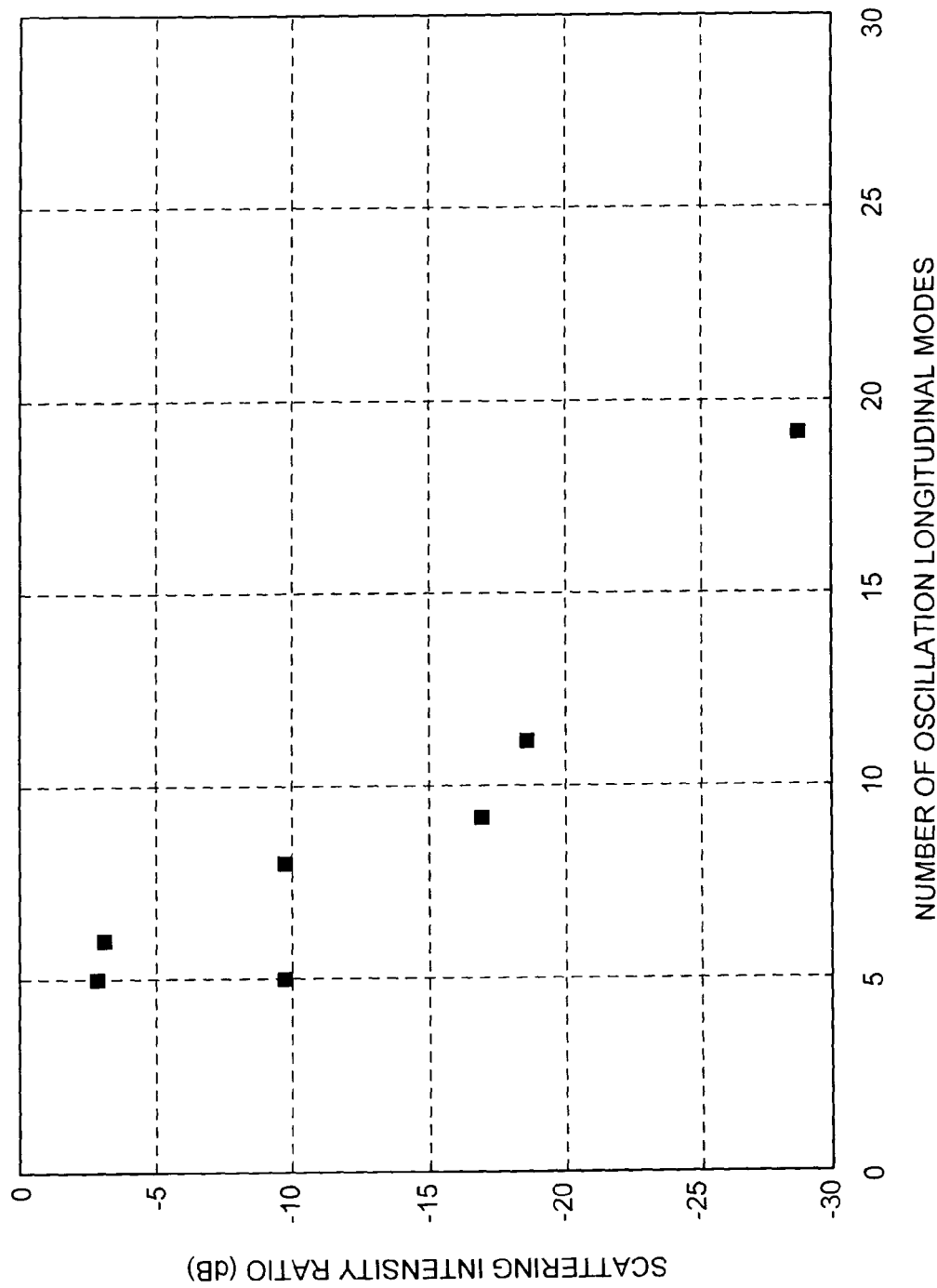
FIG. 12 is a graph that shows the relationship between the number of oscillation longitudinal modes, the difference values of which in optical intensity from an oscillation longitudinal mode having the highest optical intensity are not more than 10 dB, and the scattering intensity ratio.

The correlationship between the number of oscillation longitudinal modes the difference values of which in optical intensity from an oscillation longitudinal mode having the highest optical intensity are not more than 10 dB and the stimulated Brillouin scattering is examined. FIG. 12 is a graph that shows a measurement result for the scattering intensity ratios of a plurality of semiconductor laser apparatuses different in the number of oscillation longitudinal modes the difference values of which in optical intensity from an oscillation longitudinal mode having the highest optical intensity are not more than 10 dB. Here, measurement targets are a plurality of semiconductor laser apparatuses equal in structure except for the element, such as the diffraction gratin 13 or the like, related to the number of oscillation longitudinal modes. Measurement is carried out while maintaining the temperatures of all the semiconductor laser apparatus to 25° C. and injection current to 300 mA (milli-ampere). That is, measurement is carried out under the same conditions except for the number of oscillation longitudinal modes the difference values with which from the highest intensity are not more than 10 dB. It is noted that measurement is also carried out for semiconductor laser apparatuses each of which has less than ten oscillation longitudinal modes the difference values with which from the highest intensity are not more than 10 dB, and the measurement result is shown in FIG. 12.

As shown in FIG. 12, the number of oscillation longitudinal modes the difference values with which from the highest intensity are not more than 10 dB and the scattering intensity ratio hold an obvious correlation. When the number of oscillation longitudinal modes increases, the scattering intensity ratio decreases. In particular, when the number of oscillation longitudinal modes is about not less than 10, the scattering intensity ratio is about −15 dB and when the number of oscillation longitudinal modes is 19, the ratio is about −29 dB. Accordingly, when the number of oscillation longitudinal modes is not less than 10, it is possible to suppress the stimulated Brillouin scattering by incorporating the semiconductor laser apparatus as the pumping source into the optical fiber amplifier having optical loss of not less than 3 dB. In addition, when the number of oscillation longitudinal modes is not less than 19, it is possible to suppress the stimulated Brillouin scattering by incorporating the semiconductor laser apparatus as the exciting light source into any one of optical fiber amplifiers including the one having very low optical loss.

Figure 13:
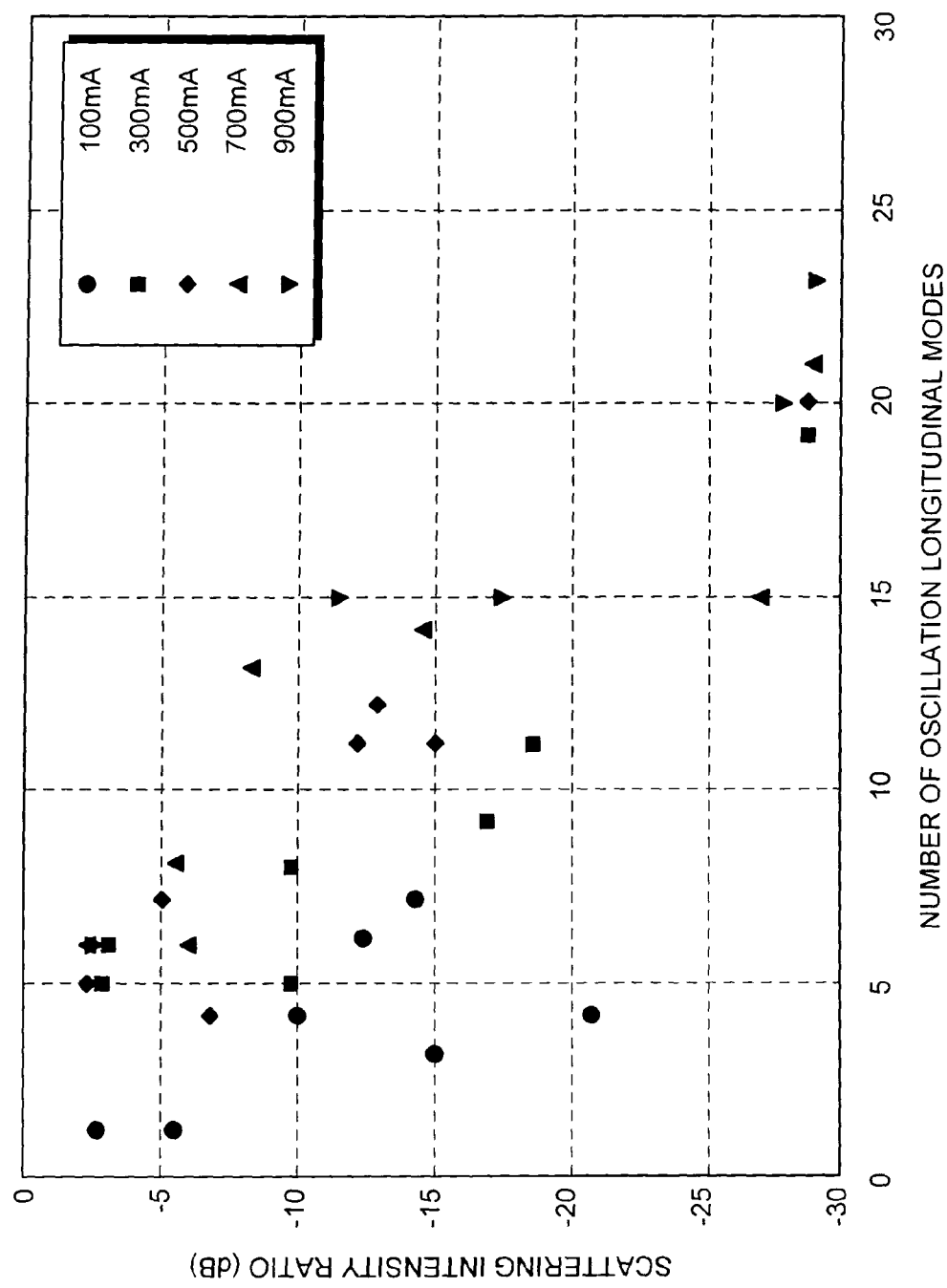
FIG. 13 is a graph that shows the relationship between the number of oscillation longitudinal modes, the difference values of which in optical intensity from an oscillation longitudinal mode having the highest optical intensity are not more than 10 dB, and the scattering intensity ratio, when injection current is changed.

As shown in FIG. 13, scattering intensity ratios are measured while injection current is changed. Here, the measurement target semiconductor laser apparatus is used as the same as that in the measurement shown in FIG. 12, and measurement is carried out while changing the injection current to 100 mA, 300 mA, 500 mA, 700 mA and 900 mA. The number of oscillation longitudinal modes changes for the same semiconductor laser apparatus due to the influence of the injection current. It is shown that when the number of oscillation longitudinal modes the difference values with which from the highest intensity are not more than 10 dB is not less than 10, the scattering intensity ratio generally tends to be suppressed to not more than −13 dB. It is also shown that when the number of oscillation longitudinal modes the difference values with which from the highest intensity are not more than 10 dB is not less than 18, the scattering intensity ratio tends to be suppressed to not more than −28 dB. These are seen irrespective of the injection current. It is, therefore, understood that the scattering intensity ratio is not directly influenced by the injection current but determined by the number of oscillation longitudinal modes the difference values with which from the highest intensity are not more than 10 dB. Normally, when injection current changes, a spectrum shape such as the number of oscillation longitudinal modes changes and the light output intensity of a semiconductor laser apparatus changes, as well. However, the result as shown in FIG. 13 also shows that the scattering intensity ratio is determined only by the number of oscillation longitudinal modes the difference values with which from the highest intensity are not more than 10 dB, irrespectively of a change in light output intensity.

Figure 14:
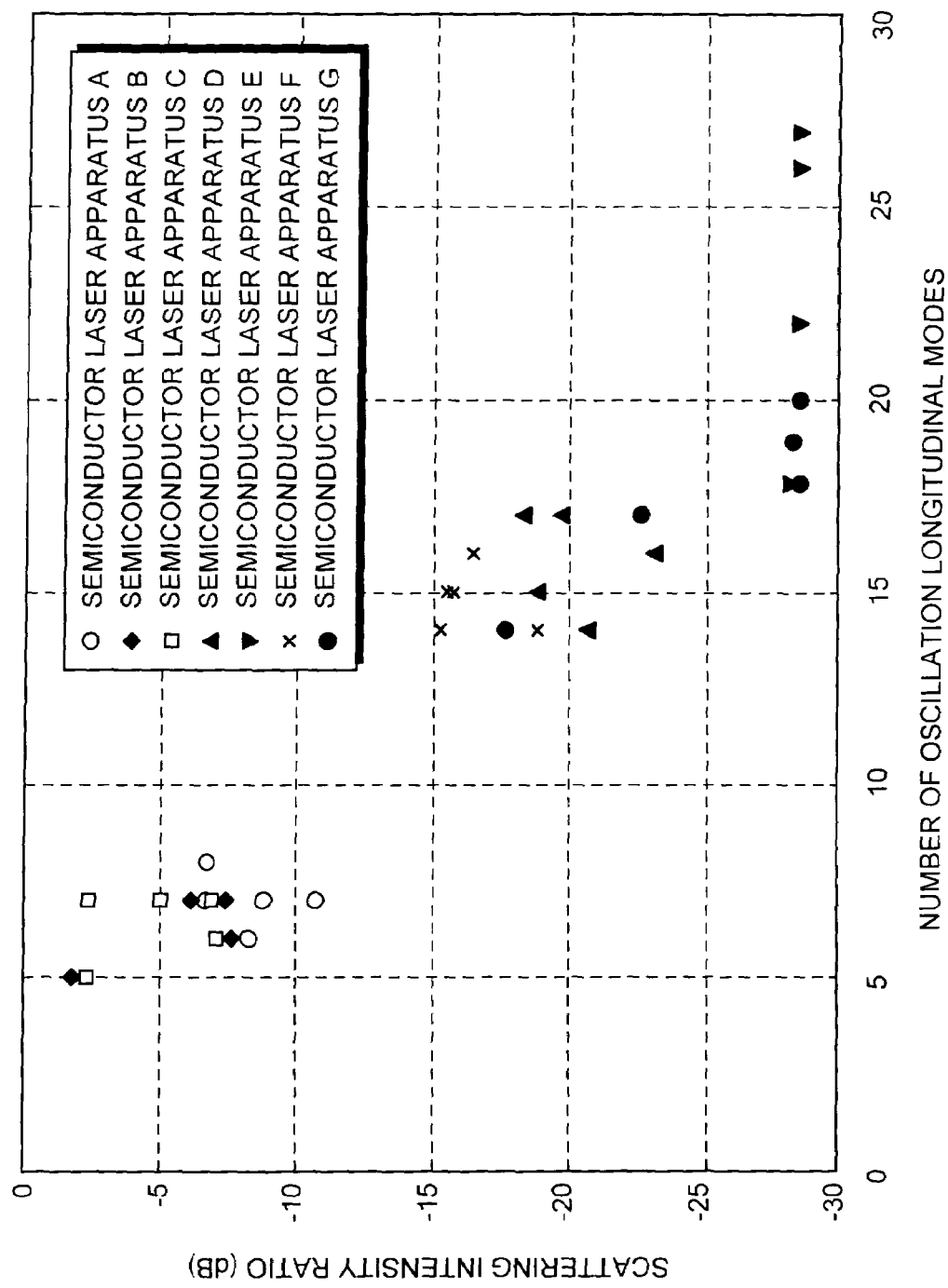
FIG. 14 is a graph that shows the relationship between the number of oscillation longitudinal modes, the difference values of which in optical intensity from an oscillation longitudinal mode having the highest optical intensity are not more than 10 dB, and the scattering intensity ratio, when the temperature of the semiconductor laser apparatus is changed.

Scattering intensity ratios are measured for a plurality of semiconductor laser apparatuses A to G while changing the temperatures of the semiconductor laser apparatuses. It is noted that measurement is carried out while changing the temperature of each semiconductor laser apparatus to 5° C., 15° C., 25° C., 35° C., and 45° C. FIG. 14 is a graph that shows the relationship between the number of oscillation longitudinal modes the difference values with which from the highest optical intensity in this measurement are not more than 10 dB and the scattering intensity ratio. The number of oscillation longitudinal modes changes for the same semiconductor laser apparatus due to the influence of temperature change. Although the temperature of the semiconductor laser apparatus influences the number of oscillation longitudinal modes, the direct relationship with the scattering intensity ratio is hardly influenced by the temperature change. Specifically, when the number of oscillation longitudinal modes the difference values with which from the highest intensity in this measurement are not more than 10 dB is not less than 10, the scattering intensity ratio is lower than −13 dB irrespective of the temperature. When the number of the oscillation longitudinal modes is not less than 18, the scattering intensity ratio is not more than −28 dB.

As is obvious from the measurement results shown in FIGS. 12 to 14, in the semiconductor laser apparatus that includes the diffraction grating 13 that selects light having a plurality of oscillation longitudinal modes, the scattering intensity ratio holds a close correlation with the number of oscillation longitudinal modes and has almost irrelevance to the injection current, light output intensity and the temperature of the semiconductor laser apparatus. When the number of oscillation longitudinal modes the difference values with which from the highest intensity are not more than 10 dB is not less than 10, the scattering intensity ratio is suppressed to not more than −13 dB and when the number thereof is not less than 18, the scattering intensity ratio is suppressed to not more than −28 dB. Therefore, when the number of oscillation longitudinal modes is not less than 10, it is possible to incorporate the semiconductor laser apparatus as a pump source, into an optical fiber amplifier that has optical loss of about 3 dB. When the number of oscillation longitudinal modes is not less than 18, it is possible to incorporate into any optical fiber amplifier.

It is understood from the measurement results shown in FIGS. 12 to 14 that the number of oscillation longitudinal modes including modes each having a relatively low intensity and having a difference value from the highest intensity of not less than 10 dB influences the occurrence of the stimulated Brillouin scattering. The inventors of the present invention estimate that an increase in the number of oscillation longitudinal modes each having a relatively low intensity causes an increase in the line width of the oscillation longitudinal mode near the highest intensity and causes a decrease in the intensities of the respective oscillation longitudinal modes, thereby suppressing the occurrence of stimulated Brillouin scattering.

Figure 15:
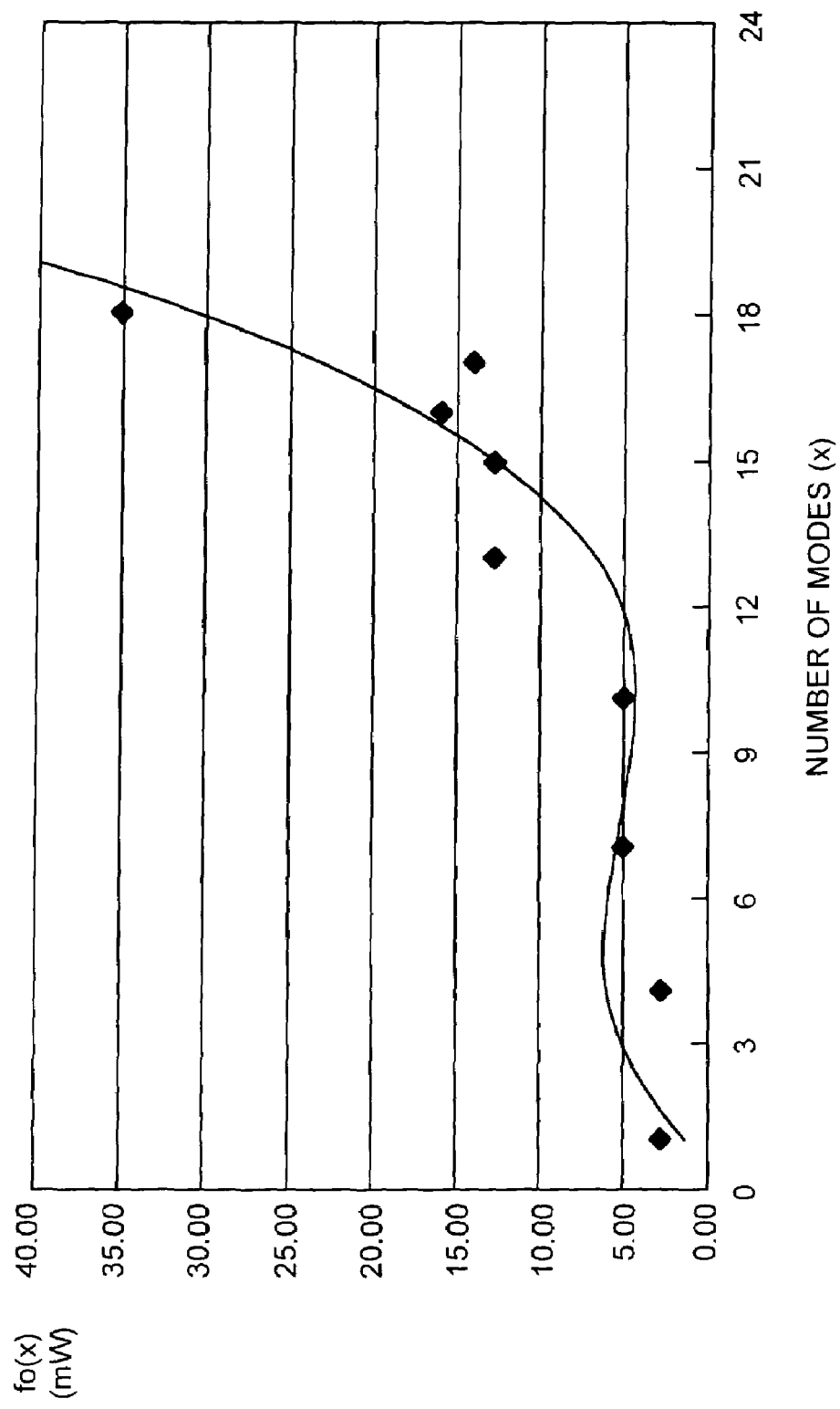
FIG. 15 is a graph that shows the relationship between a threshold f(x) of optical intensity that causes stimulated Brillouin scattering inside a DSF (Dispersion Shifted Fiber), and the number of modes of laser beams transmitting therein, when the DSF is used as a transmission optical fiber.

The inventors of the present invention has studied the relationship between the number of oscillation longitudinal modes the difference values with which from the highest intensity are not more than 10 dB and a threshold of optical intensity that causes stimulated Brillouin scattering inside the transmission optical fiber 24. FIG. 15 is a graph that shows the occurrence threshold of the stimulated Brillouin scattering, when laser beams having a different number of oscillation longitudinal modes are made to be incident on the transmission optical fiber 24 formed of a DSF. The DSF in the examples in FIG. 15 to FIG. 19 has a diameter of 7.72 μm, a fiber length of 55 km, a transmission loss of 0.21 dB/km, and dispersion of −0.07 ps/km/nm (pico-seconds/kilometer/nanometer). The effective cross section of the DSF is 46.8 μm$^2$, and the effective length is 19.2 km. It is also assumed that the wavelength of the laser beam to be transmitted is 1550 nm, and the above-mentioned characteristics as shown in FIG. 15 to FIG. 19 are obtained in this wavelength. In the examples in FIG. 15 to FIG. 19, the number of oscillation longitudinal modes (referred to as "number of modes" hereunder, as required) stands for the number of oscillation longitudinal modes the difference values of which in optical intensity from the oscillation longitudinal mode having the highest optical intensity are not more than 10 dB.

As shown in FIG. 15, the occurrence threshold of the stimulated Brillouin scattering increases with an increase in the number of modes, and particularly, when the number of modes is not less than 12, a rise of the threshold becomes noticeable. It is shown that when fitting is performed based on the actually measured value, the occurrence threshold $f_0(x)$ of the stimulated Brillouin scattering can be expressed as:

$$f_0(x) = 0.026757x^3 - 0.602546x^2 + 4.006463x - 2.317929 \quad (1)$$

where x is the number of modes.

Figure 16:
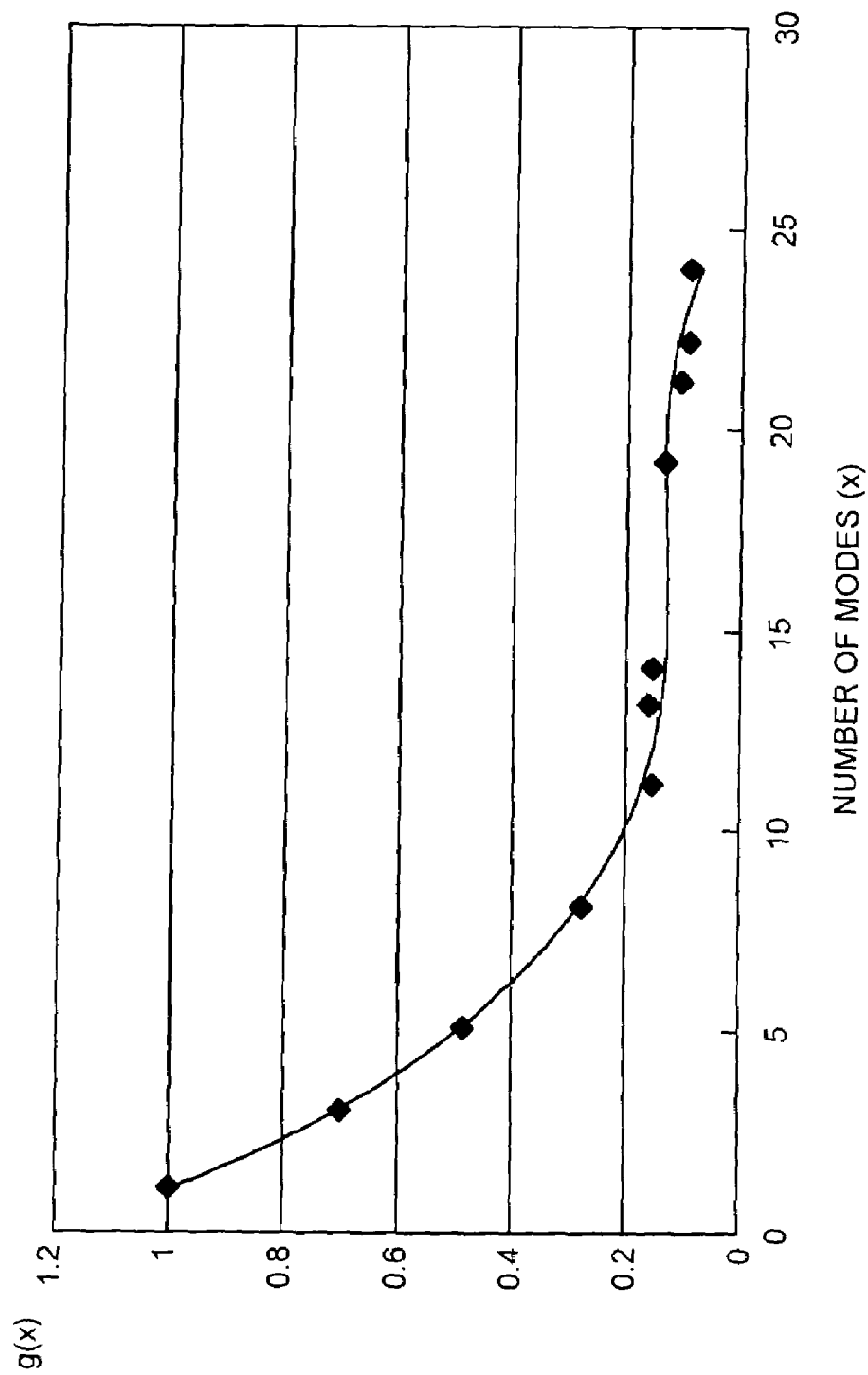
FIG. 16 is a graph that shows the relationship between a ratio g(x) of the highest optical intensity of the oscillation longitudinal modes with respect to the total intensity of the laser beams output from the semiconductor laser apparatus according to the first embodiment, and the number of modes.

FIG. 16 is a graph that shows the relationship between the number of oscillation longitudinal modes and a ratio of the highest optical intensity to the total intensity of the laser beams to be emitted. When a plurality of oscillation longitudinal modes exists, the total intensity of the laser beams is distributed to the respective oscillation longitudinal modes. Hence, the intensity of each of the oscillation longitudinal modes decreases, as compared with a case in which only one oscillation longitudinal mode exists. Therefore, as shown in FIG. 16, the ratio of the highest optical intensity to the total intensity decreases, as the number of oscillation longitudinal modes increases. In the examples shown in FIG. 15 to FIG. 19, the "total intensity" stands for a sum of optical intensities of all oscillation longitudinal modes having optical intensities that are not more than 10 dB from the highest optical intensity. When fitting is performed based on the actually measured value, the ratio g(x) of the highest optical intensity to the total intensity is expressed as:

$$g(x) = -0.00021418x^3 + 0.01097028x^2 - 0.18533490x + 1.17019287 \quad (2)$$

where x is the number of modes.

Figure 17:
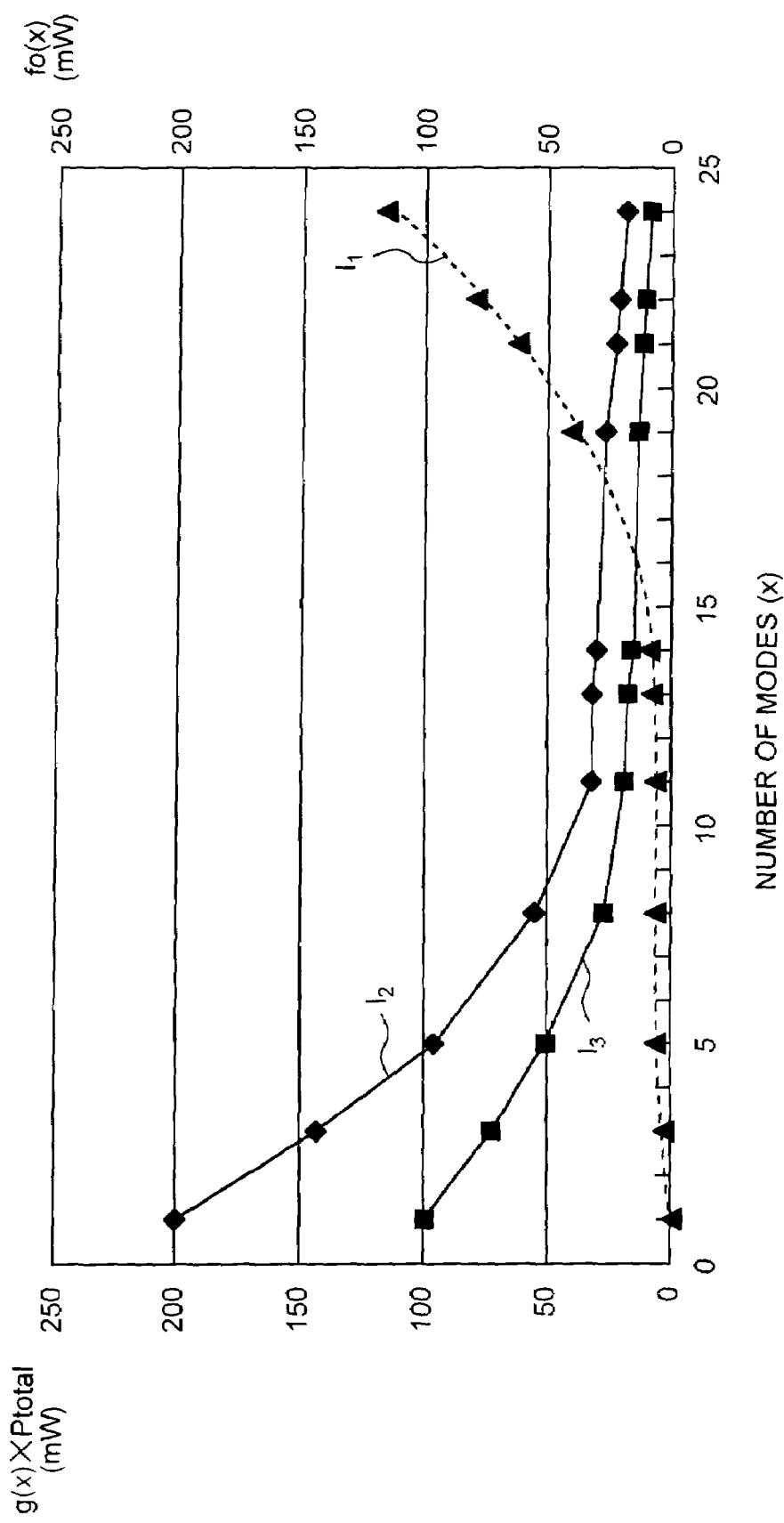
FIG. 17 is a graph that derives the number of modes that prevents occurrence of the stimulated Brillouin scattering in the DSF.

From the measurement results shown in FIG. 15 and FIG. 16, the number of oscillation longitudinal modes can be derived, which can transmit high intensity laser beams into the transmission optical fiber 24, while avoiding the stimulated Brillouin scattering. FIG. 17 is a graph that shows a curve shown in FIG. 15 and curves obtained by multiplying a curve shown in FIG. 16 by the total intensity of the laser beam. In FIG. 17, a curve $I_1$ shows the same curve as that shown in FIG. 15, which shows the relationship between the number of oscillation longitudinal modes and the occurrence threshold of the stimulated Brillouin scattering. Curves $I_2$ and $I_3$ respectively show the relationship between the number of oscillation longitudinal modes and the highest optical intensity of the oscillation longitudinal modes, and the curve $I_2$ is obtained when the total intensity is 200 mW, and the curve $I_3$ is obtained when the total intensity is 100 mW. Specifically, the curves $I_2$ and $I_3$ are obtained by multiplying the curve g(x) shown in the graph of FIG. 16 by 200 mW and 100 mW, respectively.

In order to suppress the occurrence of the stimulated Brillouin scattering in the transmission optical fiber 24, it is only necessary that all of the oscillation longitudinal modes constituting the laser beam fall below the occurrence threshold. Therefore, in FIG. 17, the occurrence of the stimulated Brillouin scattering inside the transmission optical fiber 24 can be prevented using a laser beam having the number of modes in the range in which the values of the curves $I_2$ and $I_3$ are fall below the value $I_1$. In other words, when the transmission optical fiber 24 is constituted of the DSF, the occurrence of the stimulated Brillouin scattering inside the transmission optical fiber 24 can be prevented by selecting the number of oscillation longitudinal modes (=x) so that the following equation (3) using the total intensity $P_{total}$ holds:

$$f_0(x) \geq g(x) \times P_{total} \qquad (3)$$

Specifically, as for the curve $I_2$, that is, the laser beam having the total intensity of 200 mW, when the number of oscillation longitudinal modes in the laser beam is not less than 18, the occurrence of the stimulated Brillouin scattering can be prevented. Further, as for the curve $I_3$, that is, the laser beam having the total intensity of 100 mW, when the number of oscillation longitudinal modes in the laser beam is not less than 16, the occurrence of the stimulated Brillouin scattering can be prevented. Though not shown, when the total intensity is 150 mW, the number of modes can be derived by the same method. In this case in which the total intensity is 150 mW, when the number of modes is not less than 17, the equation (3) is satisfied, and hence the occurrence of the stimulated Brillouin scattering can be prevented.

The conditions of the number of modes for suppressing the occurrence of the stimulated Brillouin scattering when an optical fiber other than the DSF is used for the transmission optical fiber 24 is explained. The inventors of the present invention have found that the effective cross section and the effective length of the optical fiber constituting the transmission optical fiber 24 affect the occurrence threshold of the stimulated Brillouin scattering. Specifically, when it is assumed that the relationship $f_0(x)$ between the number of modes and the occurrence threshold of the stimulated Brillouin scattering relating to the DSF indicated in the equation (1) is known, a relational expression f(x) in an arbitrary optical fiber can be expressed by the following equation (4):

$$f(x) = \{(A_{eff}/L_{eff})/(A_{eff0}/L_{eff0})\} \times f_0(x) \qquad (4)$$

where $A_{eff}$ and $L_{eff}$ are the effective cross section and the effective length of the arbitrary optical fiber, respectively, and $A_{eff0}$ and $L_{eff0}$ are the effective cross section and effective length of the DSF, respectively.

When an optical fiber different from the DSF is used, in order that the occurrence of the stimulated Brillouin scattering can be prevented, a laser beam having the number of modes (=x) that satisfies the following equation (5) using the f(x) is required:

$$f(x) \geq g(x) \times P_{total} \qquad (5)$$

The effective length $L_{eff}$ of the optical fiber in the equation (4) is expressed as:

$$L_{eff} = \{1 - \exp(-\alpha L)\}/\alpha \qquad (6)$$

where $\alpha$ is a fiber loss and L is the actual length of the optical fiber. The fiber loss $\alpha$ is expressed as:

$$\alpha = \log_e(P_{out}/P_{in}) \qquad (7)$$

where $P_{in}$ is an input intensity and $P_{out}$ is an output intensity of the laser beam with respect to the fiber.

It is assumed that the unit of $\alpha$ in the equations (6) and (7) is expressed by Neper (1 Neper=4.34 dB). Here, $A_{eff0}$ in the DSF is 46.8 $\mu m^2$, and $L_{eff0}$ is 19.2 km. In addition to these values, by substituting the effective length $L_{eff}$ and the effective cross section $A_{eff}$ derived by the equations (6) and (7) into the equation (4), the relationship between the occurrence threshold of the stimulated Brillouin scattering and the number of modes in an arbitrary optical fiber can be derived.

Figure 18:
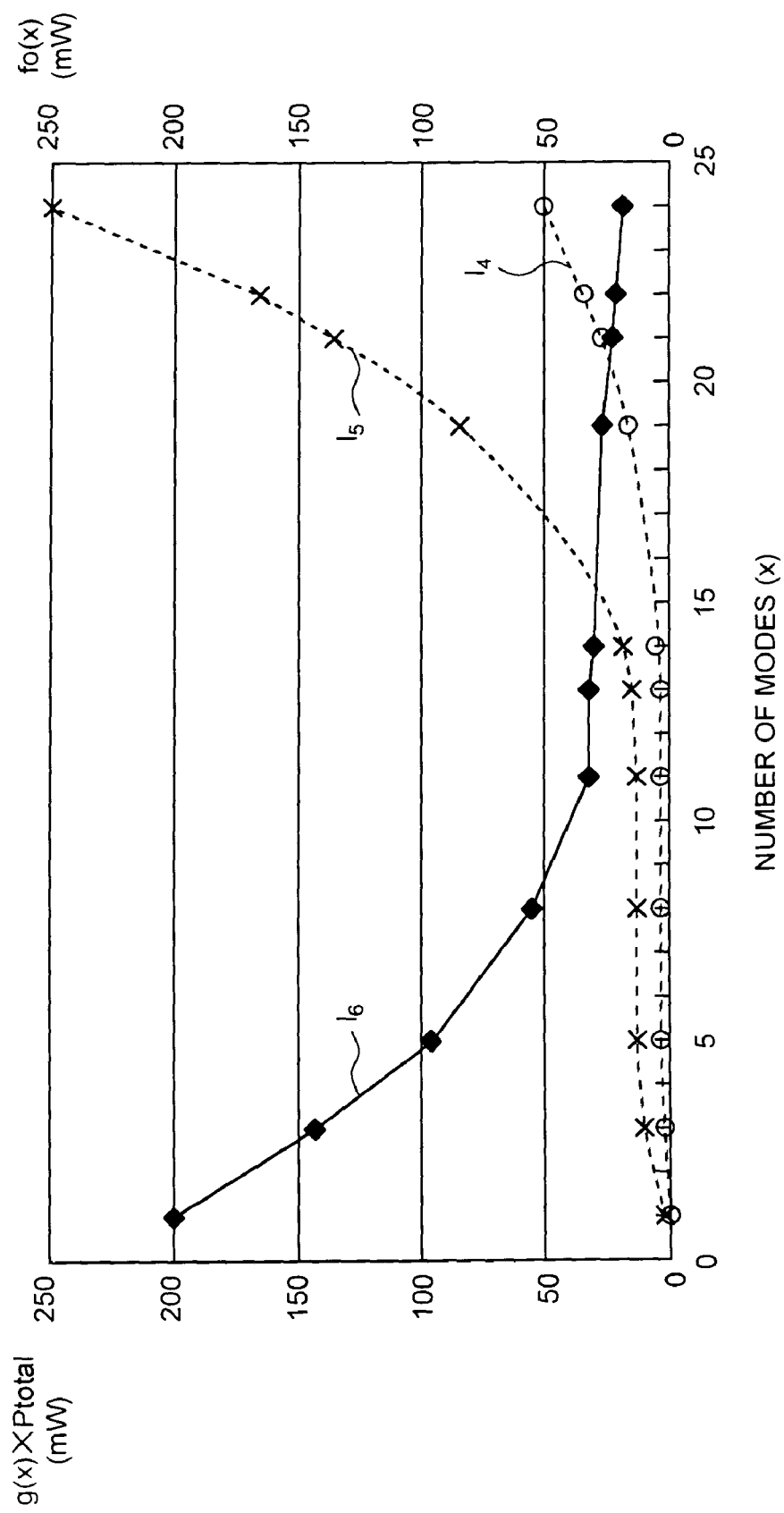
FIG. 18 is a graph that derives the number of modes that prevents occurrence of the stimulated Brillouin scattering, when laser beams having total intensity of 200 mW are transmitted in a fiber A and a fiber B that are different from the DSF.
Figure 19:
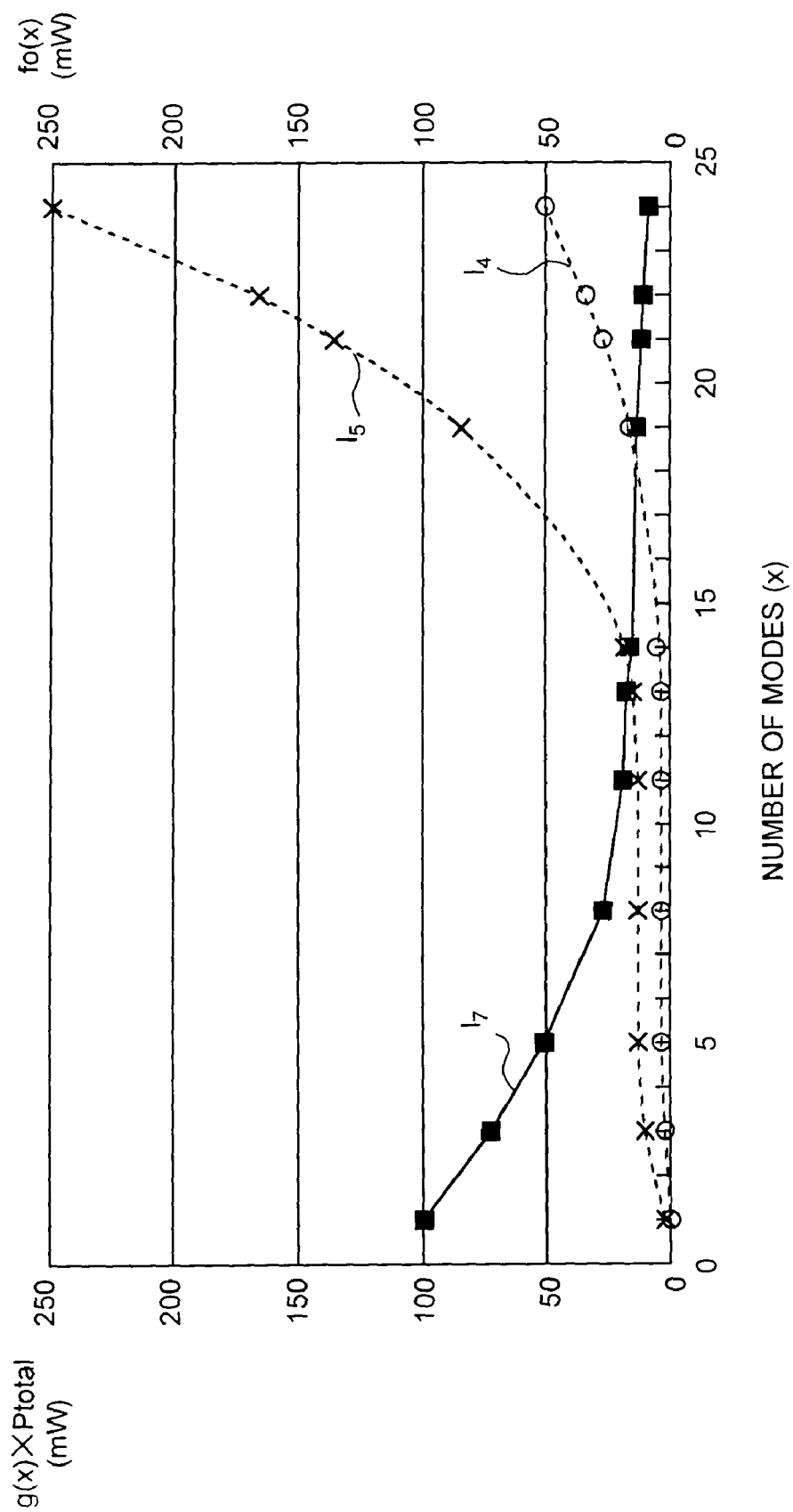
FIG. 19 is a graph that derives the number of modes that prevents occurrence of the stimulated Brillouin scattering, when laser beams having total intensity of 100 mW are transmitted in a fiber A and a fiber B that are different from the DSF.

FIG. 18 and FIG. 19 are graphs for deriving the number of oscillation longitudinal modes in which the stimulated Brillouin scattering does not occur, when an optical fiber having an effective cross section and an effective length different from those of the DSF is used for the transmission optical fiber 24. Specifically, FIG. 18 shows a graph where the total intensity of the laser beam is 200 mW, and FIG. 19 shows a graph where the total intensity of the laser beam is 100 mW.

In FIG. 18, a curve $I_4$ is a graph of f(x) relating to a fiber A different from the DSF, and a curve $I_5$ is a graph of f(x) relating to a fiber B different from the DSF and the fiber A. A curve $I_6$ is a graph that shows the result of multiplying g(x) by 200 mW, being the total intensity. The effective cross section of the fiber A is 20.0 $\mu m^2$, the effective length thereof is 19.2 km, the effective cross section of the fiber B is 100.0 $\mu m^2$, and the effective length thereof is 19.2 km. The curve $I_4$ and the curve $I_5$ are derived by substituting such values into the equation (4).

It is possible to suppress the occurrence of the stimulated Brillouin scattering by deriving the number of modes x by which the equation (5) holds in FIG. 18, and by realizing the semiconductor laser apparatus that emits the laser beam having such number of modes. Specifically, with the fiber A (curve $I_4$), when the number of oscillation longitudinal modes is not less than 21, the occurrence of the stimulated Brillouin scattering can be suppressed, and with the fiber B, when the number of oscillation longitudinal modes is not less than 16, the occurrence of the stimulated Brillouin scattering can be suppressed.

As shown in FIG. 19, when the total intensity is 100 mW, the occurrence of the stimulated Brillouin scattering can be prevented by the number of modes fewer than the case of 200 mW. In FIG. 19, the curve $I_4$ and the curve $I_5$ are the same as the curves shown in FIG. 18. A curve $I_7$ shows the result of multiplying g(x) by 100 mW, being a value of the total intensity $P_{total}$. As shown in FIG. 19, in the case of fiber A (curve $I_4$), when the number of oscillation longitudinal modes is not less than 19, the condition of equation (5) is satisfied, thereby occurrence of the stimulated Brillouin scattering can be prevented. In the case of fiber B (curve $I_5$), when the number of oscillation longitudinal modes is not less than 14, occurrence of the stimulated Brillouin scattering can be prevented. With regard to the fiber A and the fiber B, when the total intensity is 150 mW, the number of modes can be derived by the same method. When the fiber A has the oscillation longitudinal modes of not less than 20, or when the fiber B has the oscillation longitudinal modes of not less than 15, the equation (3) is satisfied, and hence occurrence of the stimulated Brillouin scattering can be prevented.

As shown in FIG. 18 and FIG. 19, even when the transmission optical fiber 24 is formed by an optical fiber different from the DSF, the number of modes that can prevent the occurrence of the stimulated Brillouin scattering can be determined, by substituting the effective cross section and the effective length into the equation (4) to derive f(x). A semiconductor laser apparatus that prevents the occurrence of the stimulated Brillouin scattering can be realized, by forming a diffraction grating so as to select the laser beam having such number of modes. Even with an optical fiber other than the fiber A and the fiber B, the similar method can be used. For example, it is indicated that when a fiber C having the effective cross section of 15.0 $\mu m^2$ and the effective length of 19.2 km is used for the transmission optical fiber 24 further when the total intensity ($P = _{total}$) is 200 mW, the occurrence of the stimulated Brillouin scattering can be prevented when the number of modes is not less than 22. Similarly, when the total intensity is 150 mW, the occurrence of the stimulated Brillouin scattering can be prevented inside the transmission optical fiber 24, when the number of modes is not less than 21. When the total intensity is 100 mW, the occurrence of the stimulated Brillouin scattering can be prevented inside the transmission optical fiber 24, when the number of modes is not less than 20. When a fiber D having the effective cross section of 9.0 μm² and the effective length of 19.2 km is used further when the total intensity is 200 mW, the occurrence of the stimulated Brillouin scattering can be prevented by designating the number of modes as 24, when the total intensity is 150 mW, by designating the number of modes as 23, and when the total intensity is 100 mW, by designating the number of modes as 22.

In the examples shown in FIG. 15 to FIG. 19, $f_0(x)$, $A_{eff0}$, and $L_{eff0}$ are values for the DSF, but the preferable number modes may be derived by the equation (4) and the like, designating values for an optical fiber other than the DSF as $f_0(x)$ and the like. Further, in the above example, $f_0(x)$ is derived based on the actually measured values for the DSF, but it may be derived from the actually measured values relating to other optical fibers, using the equation (4).

The number of modes corresponding to the total intensity is listed in Table 1, for optical fibers used for the transmission optical fiber 24, by using the measurement results shown in FIG. 15 to FIG. 19.

TABLE 1

| Type of fiber | Effective cross section μm² | Total intensity of laser $P_{total}$ mW | Necessary number of modes (pcs) | More preferable number of modes (pcs) |
|---|---|---|---|---|
| DSF-55km | 46.8 | 200 | 10 | 18 |
| DSF-55km | 46.8 | 150 | 9 | 17 |
| DSF-55km | 46.8 | 100 | 8 | 16 |
| Fiber A | 20 | 200 | 13 | 21 |
| Fiber A | 20 | 150 | 12 | 20 |
| Fiber A | 20 | 100 | 11 | 19 |
| Fiber B | 100 | 200 | 8 | 16 |
| Fiber B | 100 | 150 | 7 | 15 |
| Fiber B | 100 | 100 | 6 | 14 |
| Fiber C | 15 | 200 | 14 | 22 |
| Fiber C | 15 | 150 | 13 | 21 |
| Fiber C | 15 | 100 | 12 | 20 |
| Fiber D | 9 | 200 | 16 | 24 |
| Fiber D | 9 | 150 | 15 | 23 |
| Fiber D | 9 | 100 | 14 | 22 |

In Table 1, more preferable number of modes stands for the number of modes that can completely prevent the occurrence of the stimulated Brillouin scattering, as shown in FIG. 15 to FIG. 19. The necessary number of modes stands for the number of modes that can suppress the occurrence of the stimulated Brillouin scattering. The necessary number of modes also stands for the number of modes that can completely prevent the occurrence of the stimulated Brillouin scattering when the semiconductor laser apparatus combines with an attenuator shown in FIG. 10 and/or incorporates various transmission losses in the transmission system.

Figure 20:
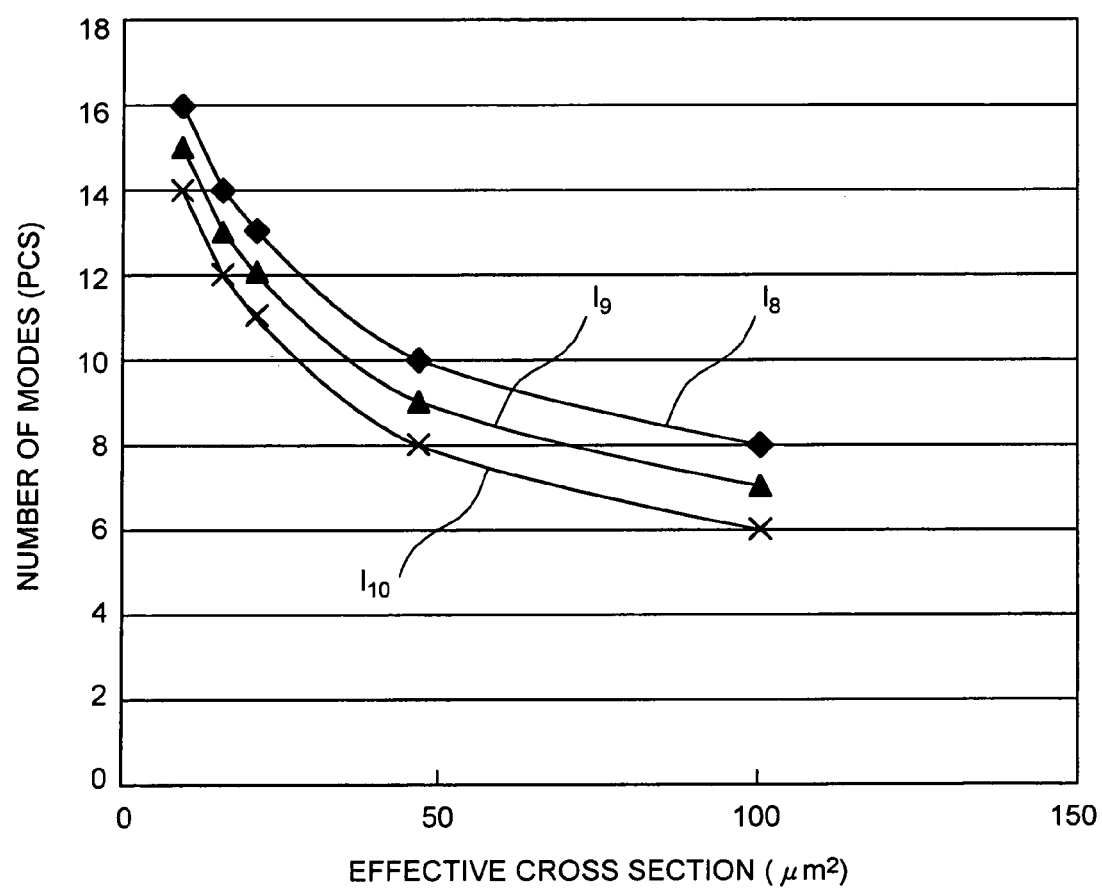
FIG. 20 is a graph that shows the relationship between an effective cross section of the transmission optical fiber and necessary number of modes.

FIG. 20 is a graph that shows the necessary number of modes for suppressing the occurrence of the stimulated Brillouin scattering in different total intensity, according to Table 1. In FIG. 20, a curve $I_8$ indicates the relationship between the necessary number of modes and the effective cross section of the optical fiber, when the total intensity is 200 mW. Curves $I_9$ and $I_{10}$ respectively indicate the relationship between the necessary number of modes and the effective cross section of the transmission optical fiber, when the total intensity is 150 mW and 100 mW. For example, when the total intensity is 200 mW and further when the number of modes belongs in a region located above the curve $I_8$, the occurrence of the stimulated Brillouin scattering can be suppressed, and by combining with the attenuator shown in FIG. 10 or by incorporating various transmission losses in the transmission system, the occurrence of the stimulated Brillouin scattering can be completely prevented.

Figure 21:
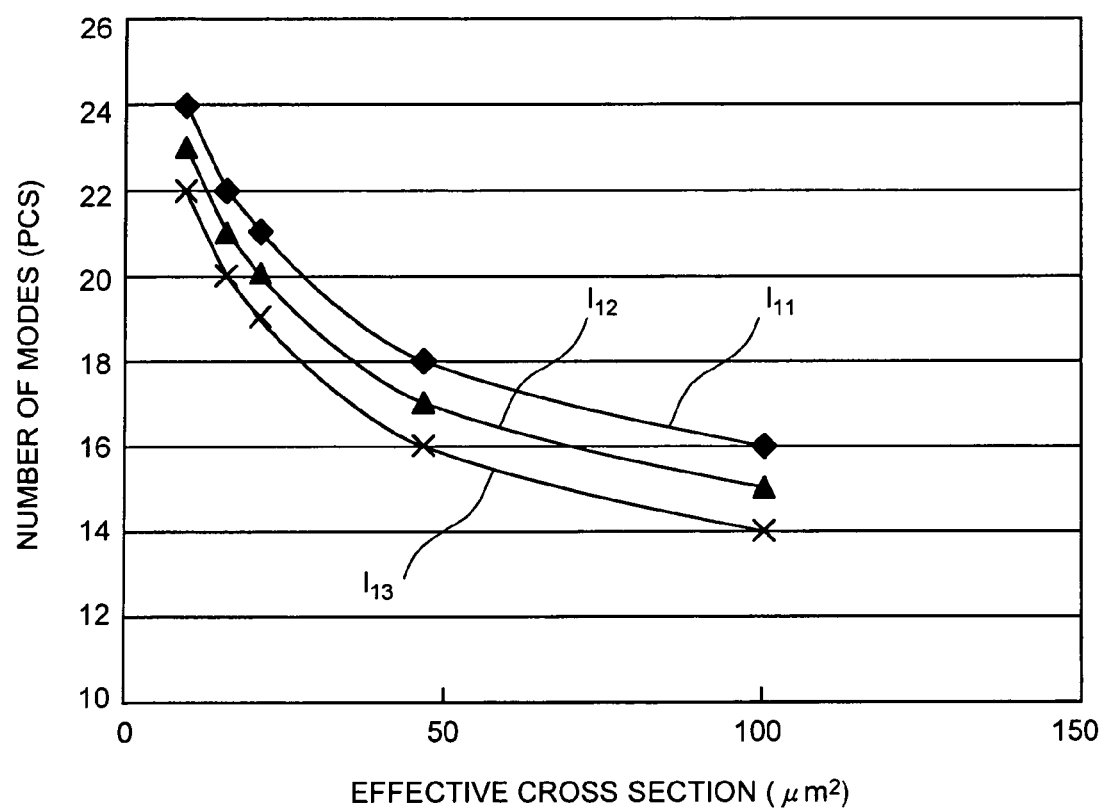
FIG. 21 is a graph that shows the relationship between the effective cross section of the transmission optical fiber and more preferable number of modes.

FIG. 21 is a graph that shows more preferable number of modes, from a viewpoint of preventing the occurrence of the stimulated Brillouin scattering in different total intensity, according to Table 1. In FIG. 21 a curve $I_{11}$ indicates more preferable number of modes when the total intensity is 200 mW, and curves $I_{12}$ and $I_{13}$ respectively indicate the relationship between the necessary number of modes and the effective cross section of the transmitted optical fiber, when the total intensity is 150 mW and 100 mW.

The relationship between the RMS method-based spectrum width $\Delta\lambda_{RMS}$ and the scattering intensity ratio is examined when the emission wavelength spectrum formed by a plurality of oscillation longitudinal modes selected by the diffraction grating 13 has a slice level of −20 dB. The reason for employing the RMS method-based spectrum width $\Delta\lambda_{RMS}$ at the slice level of −20 dB is as follows. As explained above, the inventors of the present invention estimate that oscillation longitudinal modes each having a relatively low intensity influence the line widths of oscillation longitudinal modes each having a high intensity and, therefore, influence the occurrence of the stimulated Brillouin scattering. It is, therefore, necessary to use the spectrum width at a low slice level corresponding to the oscillation longitudinal modes having low intensity. For that reason, the spectrum width $\Delta\lambda_{RMS}$ is obtained by the RMS method for a longitudinal mode group having a slice level of −20 dB (i.e. the ratio with the highest intensity is not more than −20 dB) and the relationship with the scattering intensity ratio is examined.

Figure 22:
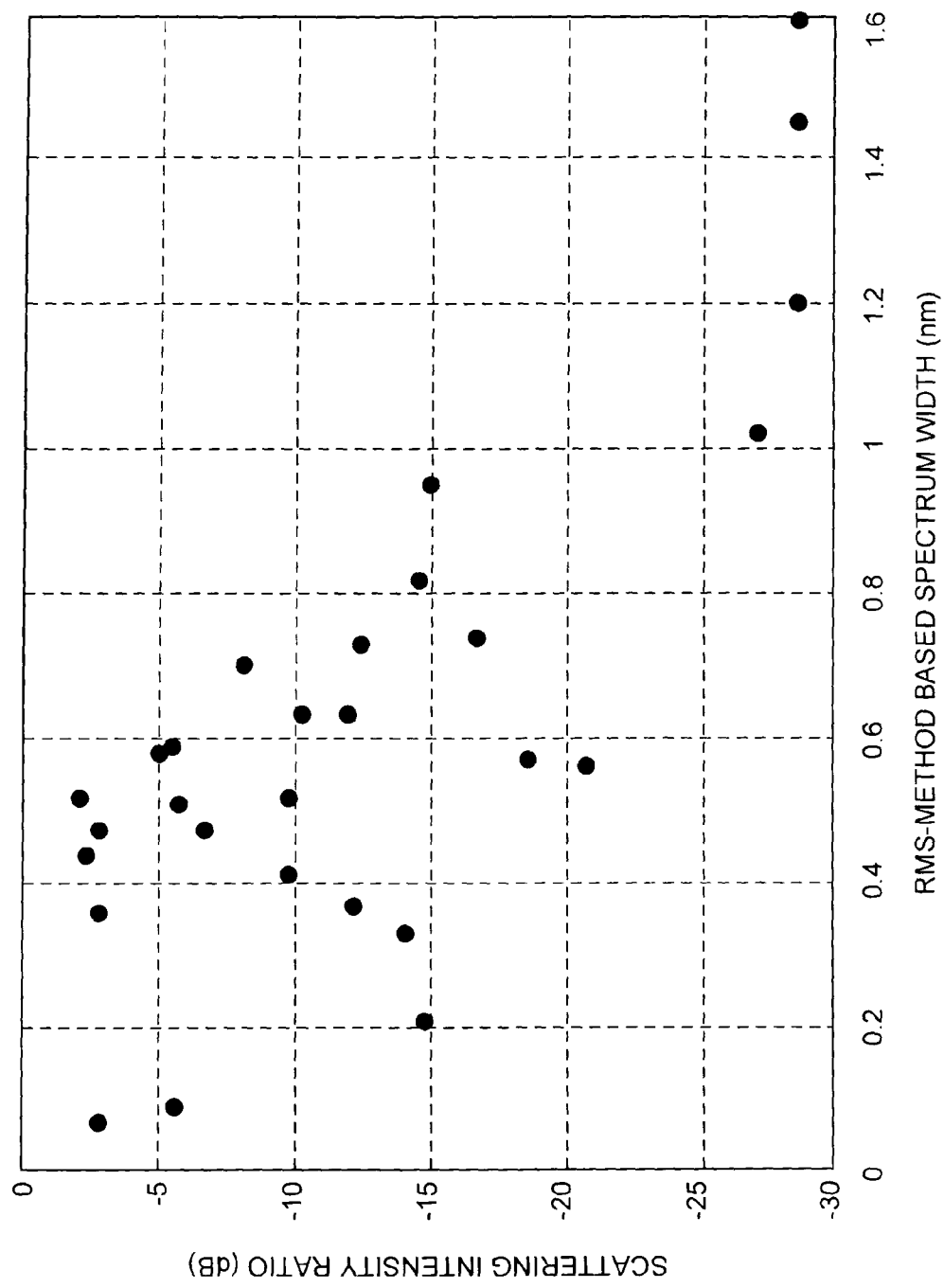
FIG. 22 is a graph that shows the relationship between an RMS method-based spectrum width and a scattering intensity ratio at a slice level of −20 dB with respect to oscillation wavelength spectrum.

FIG. 22 is a graph that shows the relationship between the spectrum width $\Delta\lambda_{RMS}$ and the scattering intensity ratio obtained by the measurement. Here, a plurality of semiconductor laser apparatuses with only the structures, such as the diffraction gratings, of which related to oscillation longitudinal modes are changed, are employed as measurement targets and the measurement is carried out while changing injection current value and temperature.

As shown in FIG. 22, when the spectrum width $\Delta\lambda_{RMS}$ increases, the scattering intensity ratio generally tends to decrease. In particular, when the spectrum width $\Delta\lambda_{RMS}$ is not less than 0.7 nm, the scattering intensity ratio is not more than −13 dB and when the spectrum width $\Delta\lambda_{RMS}$ is not less than 1.0 nm, the scattering intensity ratio is not more than −28 dB. Therefore, when the spectrum width $\Delta\lambda_{RMS}$ is not less than 0.7 nm, it is possible to use as a pump source in a normal optical fiber amplifier having optical loss of not less than 3 dB. In addition, when the spectrum width $\Delta\lambda_{RMS}$ is not less than 1.0 nm, it is possible to use as a pump source in any one of the optical fiber amplifiers including one having very small optical loss.

As can be understood, the scattering intensity ratio, the injection current value and the temperature of the semiconductor laser apparatus are hardly directly relevant to one another, and the scattering intensity ratio is determined by the number of oscillation longitudinal modes the difference values with which from the highest intensity are not more than 10 dB or by the RMS method-based spectrum width $\Delta\lambda_{RMS}$. The semiconductor laser apparatus according to the first embodiment can, therefore, when oscillating under arbitrary injection current and temperature conditions, suppress the occurrence of stimulated Brillouin scattering as long as the number of oscillation longitudinal modes or the RMS method-based spectrum width $\Delta\lambda_{RMS}$ satisfies these conditions.

It is preferable that the semiconductor laser apparatus according to the first embodiment satisfies conditions for the number of oscillation longitudinal modes or the RMS method-based spectrum $\Delta\lambda_{RMS}$ throughout a design temperature range and a design injection current range. Even when it satisfies the conditions only in the temperature range or current range other than the design temperature range or injection current range, the occurrence of stimulated Brillouin scattering can be suppressed by limiting the use of the semiconductor laser apparatus to the temperature range or current range. That is, all the semiconductor laser apparatuses that satisfy the conditions in a predetermined temperature range and a predetermined current range can exhibit equivalent functions and advantages to those of the semiconductor laser apparatus explained above.

As for structure of the semiconductor laser apparatus, the conductive type may be reversed and not the buried-hetero (BH) structure as shown in FIG. 1 but a ridge laser or an self-aligned structure (SAS) type laser may be employed. Moreover, the position of the diffraction grating 13 is not limited to the upper region of the GRIN-SCH-MQW active layer 3 but may be the lower region thereof. Further, the diffraction grating 13 can be basically arranged in any region as long as light is distributed to the region in the lasing process. As for the horizontal width of the diffraction grating 13, the grating may be arranged entirely or may be arranged partially. Furthermore, the active layer does not necessarily have a GRIN-SCH-MQW structure but may have a simple double-hetero structure or a homo junction laser may be used. Besides, not a multi quantum well structure but a single quantum well structure may be used.

A semiconductor laser usage determining method according to a second embodiment will be explained. As explained in the first embodiment, to suppress the occurrence of stimulated Brillouin scattering in a semiconductor laser apparatus that selects a plurality of oscillation longitudinal modes, the number of oscillation longitudinal modes the difference values of which in optical intensity from an oscillation longitudinal mode having the highest optical intensity are not more than 10 dB, may be not less than a predetermined number or an RMS method-based spectrum width $\Delta\lambda_{RMS}$ may be not less than a predetermined value. The number of oscillation longitudinal modes and the spectrum width $\Delta\lambda_{RMS}$ are mainly determined by the structure of the semiconductor laser apparatus such as a diffraction grating. It is, therefore, theoretically possible that all the semiconductor laser apparatuses each having a predetermined structure suppress the occurrence of stimulated Brillouin scattering.

Actually, however, there exist semiconductor laser apparatuses, though in small numbers, the number of oscillation longitudinal modes and the spectrum width $\Delta\lambda_{RMS}$ of which are not the same as designed ones because of manufacturing irregularity or the like. When such a semiconductor laser apparatus is employed as a pump source, the occurrence of stimulated Brillouin scattering cannot be suppressed. Therefore, it is determined whether or not it can be employed as pump source using a semiconductor laser usage determining method according to the second embodiment.

Figure 23:
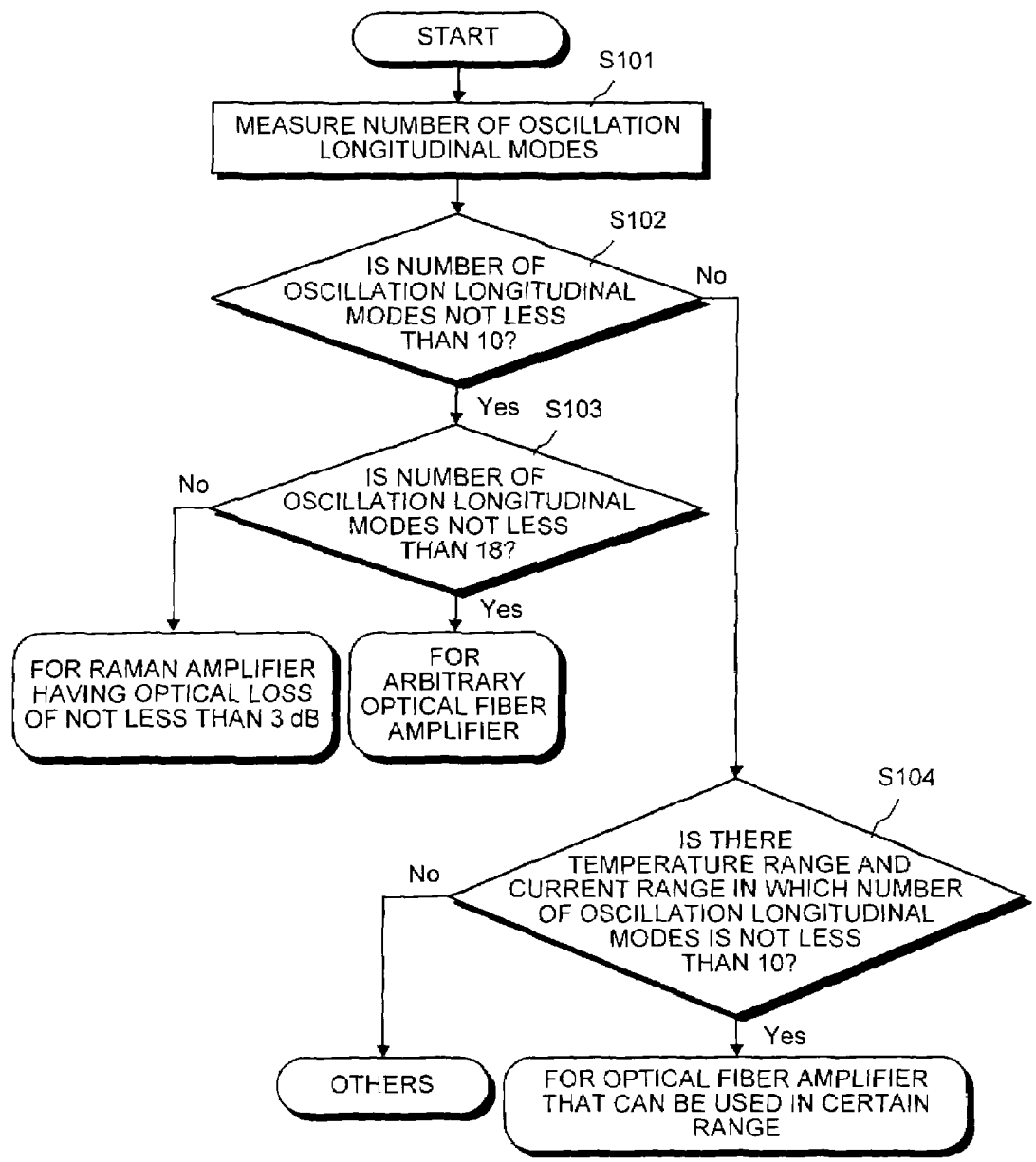
FIG. 23 is a flowchart that shows the content of a semiconductor laser usage determining method according to a second embodiment.

Concrete processes of the semiconductor laser usage determining method according to the second embodiment are explained below. FIG. 23 is a flow chart that explains the semiconductor laser usage determining method according to the second embodiment.

The number of oscillation longitudinal modes is first measured (step S101). Specifically, a lasing process is performed under a design temperature range and a design injection current range, the waveform of a laser beam is observed by a spectrum analyzer or the like and the number of oscillation longitudinal modes, the difference values of which in optical intensity from an oscillation longitudinal mode having the highest optical intensity are not more than 10 dB, is measured.

It is determined whether or not the number of oscillation longitudinal modes measured at the step S101 is not less than 10 (step S102). When the number of oscillation longitudinal modes is less than 10, a step S104 to be explained later is executed. When the number of oscillation longitudinal modes is not less than 10, the next step S103 is executed.

In the step S103, it is determined whether or not the number of oscillation modes measured at the step S101 is not less than 18 (step S103). When the number of oscillation longitudinal modes is not less than 18, it can be employed as a pump source in an arbitrary optical fiber amplifier having low optical loss as explained in the first embodiment. Consequently, the semiconductor laser apparatus having not less than 18 oscillation longitudinal modes is sorted as a general purpose one.

On the other hand, even when it is determined that the number of oscillation longitudinal modes is less than 18 at the step S103, it is determined to be not less than 10 at the step S102. Therefore, as explained in the first embodiment, it can be employed in an optical fiber amplifier having optical loss of not less than 3 dB. As a result, the semiconductor laser apparatus determined to have less than 18 is sorted as a pump source in an optical fiber amplifier having optical loss of not less than 3 dB. Alternatively, it can be sorted as one for a Raman amplifier to which a dither circuit is attached (see Japanese Patent Application No. 2001-369145) or an EDFA (Erbium Doped Fiber Amplifier) that has no optical loss.

As for the semiconductor laser apparatus determined that the number of oscillation longitudinal modes is less than 10 in the design temperature range and the design injection current range at the step S102, it is determined whether there exist a temperature range and a current range in which the number of oscillation longitudinal modes is not less than 10 (step S104). As shown in FIG. 13 and FIG. 14, the number of oscillation longitudinal modes is influenced by injection current and temperature. For that reason, there is a case in which the number of oscillation longitudinal modes is not less than 10 in a part of the design temperature range and a part of the design injection current range. In that case, it can be employed as the pump source of an optical fiber amplifier in the partial ranges. Therefore, when satisfying the conditions of the step S104, it is sorted as the pump source of an optical fiber amplifier in a limited temperature range and in a limited injection current range. When there are no such a temperature range and an injection current range that the number of oscillation longitudinal modes is not less than 10, the occurrence of stimulated Brillouin scattering cannot be suppressed. As a result, the semiconductor laser apparatus is sorted as a pump source for an optical fiber amplifier in which the distance between the pump source and the amplification optical fiber is short, i.e., in which the occurrence of stimulated Brillouin scattering does not cause any problem such as an optical fiber amplifier that employs an EDF other than a remote pump. Alternatively, it is sorted for an optical fiber amplifier that has optical loss to such an extent that is lager than 3 dB, and can be suppressed stimulated Brillouin scattering.

Figure 24:
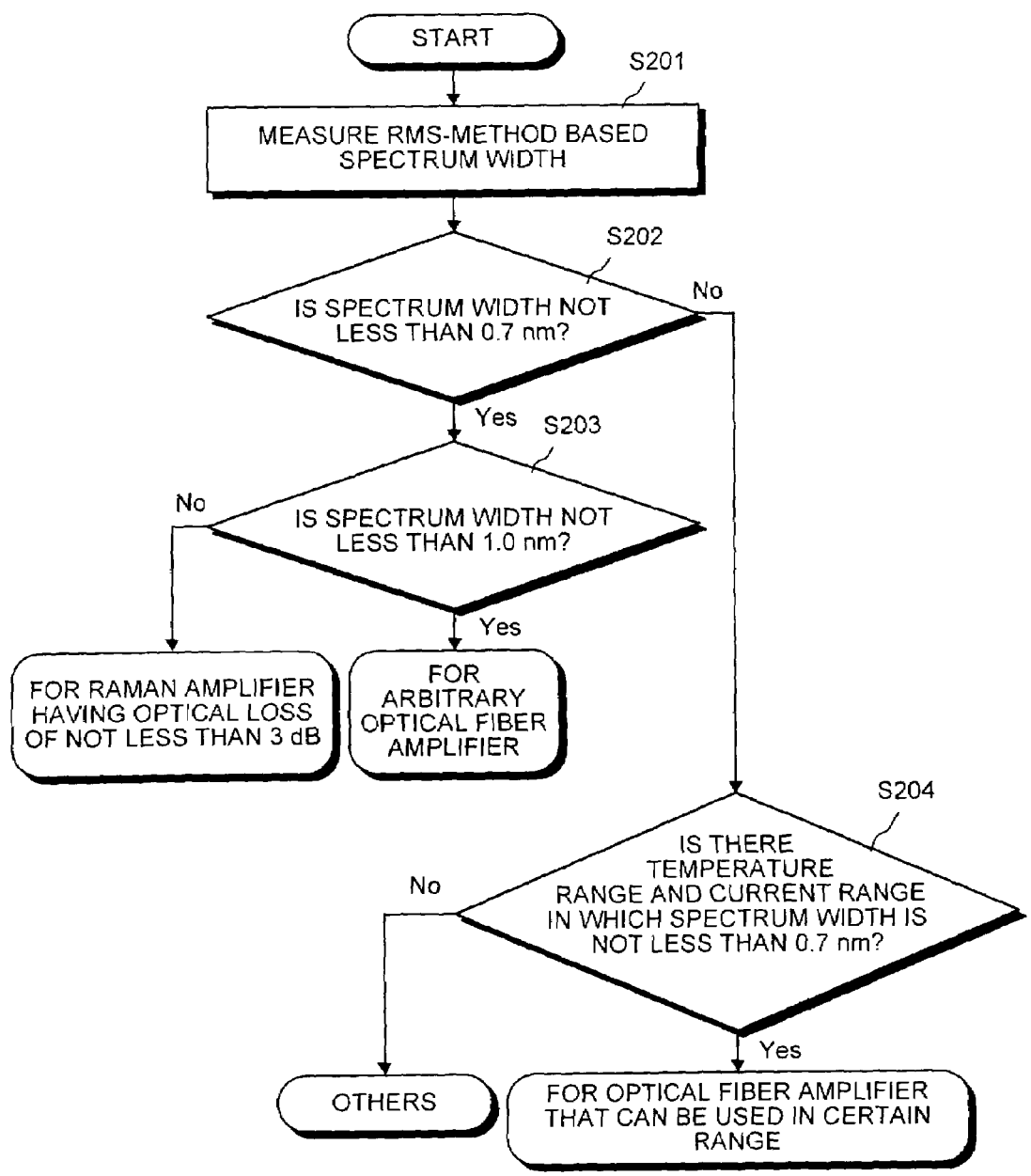
FIG. 24 is a flowchart that shows the content of a semiconductor laser usage determining method according to a modified example of the second embodiment.

As a modification of the semiconductor laser usage determining method in the second embodiment, there is a method of determining usage of semiconductor laser apparatuses according to an RMS method-based spectrum width $\Delta\lambda_{RMS}$ at a slice level of −20 dB for an emission wavelength spectrum formed by a plurality of oscillation modes. FIG. 24 is a flow chart that explains the usage determining method in the modification.

An RMS-method based spectrum width $\Delta\lambda_{RMS}$ is first measured for a semiconductor laser apparatus to be measured (step S201). Specifically, the lasing process is performed under a design temperature range and a design injection current range, the waveform of a laser beam is observed by a spectrum analyzer or the like and the RMS method-based spectrum width $\Delta\lambda_{RMS}$ is measured.

It is then determined whether or not the RMS method-based spectrum width $\Delta\lambda_{RMS}$ is not less than 0.7 nm (step S202). When the spectrum width $\Delta\lambda_{RMS}$ is not less than 0.7 nm, a step S203 is executed. On the other hand, when there is a temperature range or an injection current range with less than 0.7 nm in the design temperature range or the design injection current range, a step S204 is executed.

In the step S203, it is determined whether or not the RMS method-based spectrum width $\Delta\lambda_{RMS}$ measured at the step S201 is not less than 1.0 nm (step S203). When the spectrum width $\Delta\lambda_{RMS}$ is not less than 1.0 nm, it is possible to sufficiently suppress the occurrence of stimulated Brillouin scattering as explained in the first embodiment. As a result, the semiconductor laser apparatus can be employed as a pump source for any optical fiber amplifier and is, therefore, sorted as a general one.

On the other hand, even when the spectrum width $\Delta\lambda_{RMS}$ is less than 1.0 nm at the step S203, the spectrum width $\Delta\lambda_{RMS}$ is determined to be not less than 0.7 nm at the step S202. Therefore, as explained in the first embodiment, it can be employed as a pump source for an optical fiber amplifier having optical loss of not less than 3 dB. As a result, the semiconductor laser apparatus determined to have a spectrum width $\Delta\lambda_{RMS}$ of less than 1.0 nm at the step S203 is sorted as a pump source for a Raman amplifier having optical loss of not less than 3 dB. Alternatively, it can be sorted as one for a Raman amplifier to which a dither circuit is attached or for an EDFA (Erbium Doped Fiber Amplifier) that has no optical loss.

When at the step S202, the RMS method-based spectrum width $\Delta\lambda_{RMS}$ is less than 0.7 nm in the design temperature range and the design injection current range, it is determined whether or not there is a temperature range or a current range in which the spectrum width $\Delta\lambda_{RMS}$ is not less than 0.7 nm (step S204). This is because even when the spectrum width $\Delta\lambda_{RMS}$ is not less than 0.7 nm in the entire design temperature range and the entire injection current range, it can be employed as a pump source by limiting the range to a temperature range or a current range in which the spectrum width $\Delta\lambda_{RMS}$ is not less than 0.7 nm. When there is a temperature range or a current range in which the spectrum width $\Delta\lambda_{RMS}$ is not less than 0.7 nm, it is sorted as a semiconductor laser apparatus to be used as a pump source limited to that range. When there does not exist a range in which it is not less than 0.7 nm, the semiconductor laser apparatus is sorted as a semiconductor laser apparatus to be used as the pump source of an optical fiber amplifier in which the distance between a pump source and an EDF is short or a semiconductor laser apparatus for an optical fiber amplifier that has optical loss larger than 3 dB and to the extent that stimulated Brillouin scattering can be suppressed.

Determining usage of semiconductor laser apparatuses by the semiconductor laser method according to the second embodiment and the modification provides the following advantages. Even when the number of oscillation longitudinal modes or the RMS method-based spectrum width $\Delta\lambda_{RMS}$ changes due to manufacturing irregularity or the like, determining can be performed by executing the method. As explained in the first embodiment, whether or not stimulated Brillouin scattering occurs to a semiconductor laser apparatus is not directly related to the temperature or injection current of the semiconductor laser apparatus but determined by the number of oscillation longitudinal modes or the RMS method-based spectrum width $\Delta\lambda_{RMS}$. Therefore, by measuring the number of oscillation longitudinal modes or the RMS method-based spectrum width $\Delta\lambda_{RMS}$, it is possible to sort semiconductor laser apparatuses into those which stimulated Brillouin scattering occurs and those which stimulated Brillouin scattering does not occur.

The number of oscillation longitudinal modes or the RMS method-based spectrum width $\Delta\lambda_{RMS}$ can be easily measured by observing the waveform of emission light. As a result, the structure of a measurement device necessary to sort semiconductor laser apparatuses can be simplified. Namely, it is advantageously possible to dispense with the complicated measurement device as shown in FIG. 10.

Since the temperature range and the current range in which no stimulated Brillouin scattering occurs are determined at the step S104 or S204, even a semiconductor laser apparatus that does not satisfy the conditions in the entire design range and the entire injection current range can be employed as a pump source. That is, even when the semiconductor laser apparatus cannot be used over the entire range, the semiconductor laser apparatus can suppress the occurrence of stimulated Brillouin scattering and can be employed as a pump source by limiting the temperature range or the current range.

In the modification, the spectrum width $\Delta\lambda_{RMS}$ is measured while the RMS method-based slice level is set at −20 dB. It is also possible to measure the spectrum width $\Delta\lambda_{RMS}$ at other slice levels and to sort semiconductor laser apparatuses. This is because a spectrum width reflected by an oscillation longitudinal mode having a low intensity suffices to determine whether or not stimulated Brillouin scattering occurs. Therefore, the spectrum width may be measured by further decreasing the slice level to, for example, −21 dB, −22 dB or less. The spectrum width as a reference for the slice level of −21 dB in sorting is wider than 0.7 nm and the spectrum width as a reference for the slice level of −22 dB in sorting is wider than 1.0 nm, compared with when it is of −20 dB, respectively. Further, the slice level may be set at −19 dB, −18 dB or more if it is possible to reflect an oscillation longitudinal mode having a low intensity on the spectrum width at such a slice level. When the slice level is set at −19 dB, −18 dB or more, the spectrum width as a reference in sorting is narrower than 0.7 nm and 1.0 nm. Those skilled in the art can easily determine a spectrum width as a reference in sorting when the slice level is changed using the measurement device shown in FIG. 10 or the like.

A third embodiment of the present invention is explained next. In the third embodiment, the semiconductor laser apparatus shown in the first embodiment is modularized.

Figure 25:
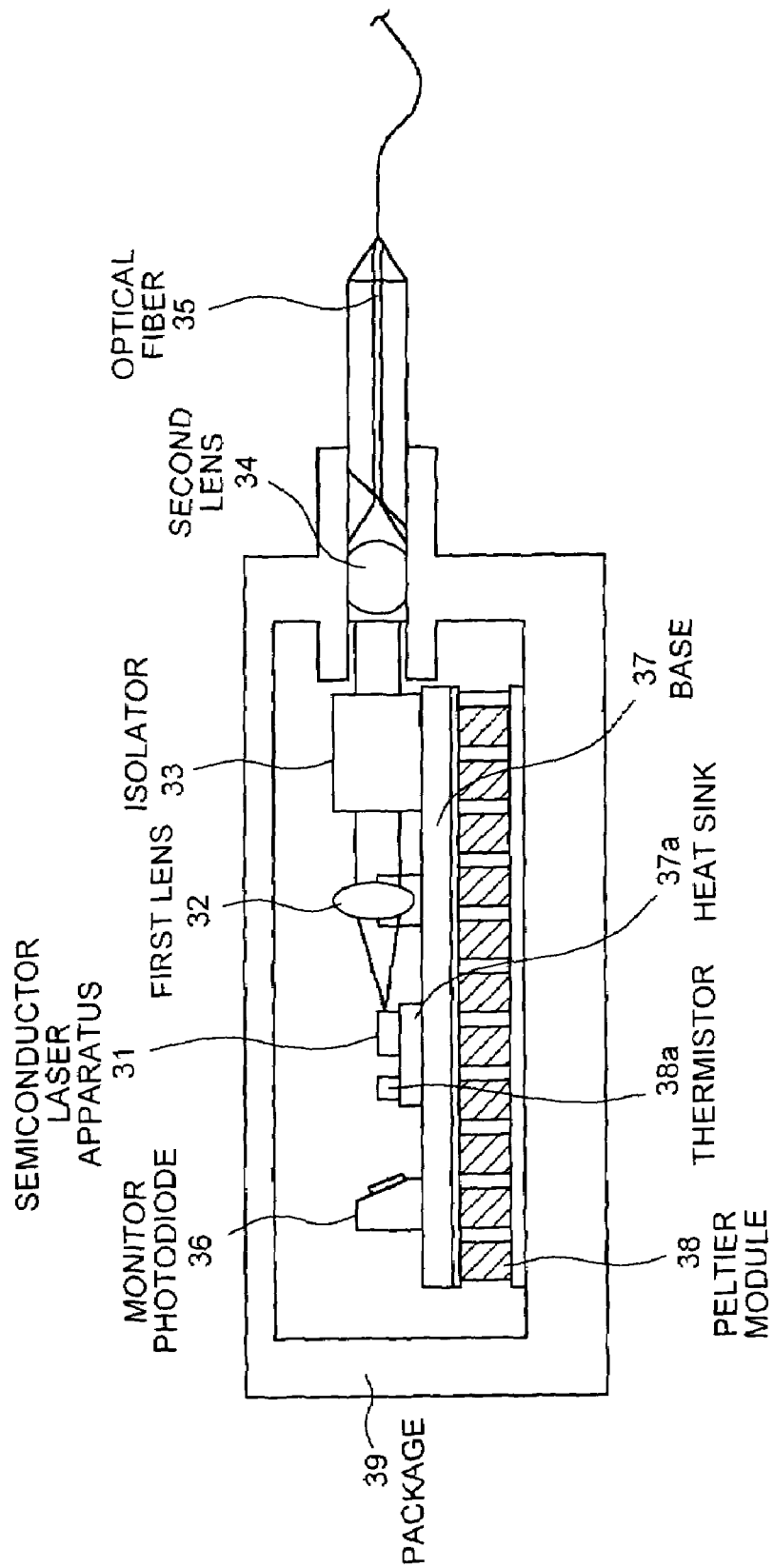
FIG. 25 is a side cross-sectional view that shows the structure of a semiconductor laser module according to a third embodiment.

FIG. 25 is a side cross-sectional view that shows the configuration of a semiconductor laser module according to the third embodiment. In FIG. 25, this semiconductor laser module has a semiconductor laser apparatus 31 corresponding to the semiconductor laser apparatus shown in the first embodiment. A Peltier module 38 that serves as a temperature control device is arranged on the inside bottom of a package 39 that serves as the housing of the semiconductor laser module and formed out of Cu—W alloy or the like. A base 37 is arranged on the Peltier module 38, and a heat sink 37a is arranged on the base 37. The Peltier module 38 is applied with current, not shown, and cools or heats depending to the polarity of the current, it mainly functioning as a cooler so as to prevent the emission wavelength shift of the semiconductor laser apparatus 31 due to temperature rise. Namely, when a laser beam has a larger wavelength than a desired wavelength, the Peltier module 38 is controlled to have low temperature as a cooler. When a laser beam has a smaller wavelength than a desired wavelength, it is controlled to have high temperature as a heater. Specifically, this temperature control is conducted based on the detection value of a thermistor 38a arranged on the heat sink 37a in the vicinity of the semiconductor laser apparatus 31. A control device, not shown, controls the Peltier module 38 so as to keep the temperature of the heat sink 37a constant. In addition, the control device, not shown, controls the Peltier module 38 so as to decrease the temperature of the heat sink 37a as the driving current of the semiconductor laser apparatus 31 is raised. By conducting such temperature control, it is possible to improve the wavelength stability of the semiconductor laser apparatus 31 and to effectively improve yield. The heat sink 37a is preferably formed out of a material, such as diamond, having high thermal conductivity. This is because the heat sink 37a formed out of diamond suppresses heat generation during the injection of high current. In this case, wavelength stability is further improved and temperature control is facilitated.

The heat sink 37a on which the semiconductor laser apparatus 31 and the thermistor 38a are arranged, a first lens 32 and a monitor photodiode 36 are provided on the base 37. A laser beam emitted from the semiconductor laser apparatus 31 propagates in an optical fiber 35 through the first lens 32, an isolator 33 and a second lens 34. The second lens 34 which is on the optical axis of the laser beam, is provided on a package 39 and optically connected to the optical fiber 35 connected to the outside. The monitor photodiode 36 monitors and detects light leaking from the reflection film-side of the semiconductor laser apparatus 31.

The isolator 33 is interposed between the semiconductor laser apparatus 31 and the optical fiber 35 in this semiconductor laser module so as to prevent reflected return light by the other optical components from being input again into the resonator of the semiconductor laser apparatus 31. As this isolator 33, not an inline polarization-independent type but a small-sized polarization-dependent type isolator can be employed unlike a conventional semiconductor module that employs a fiber grating. This makes it possible to attain low relative intensity noise (RIN), to decrease insertion loss caused by the isolator and to reduce cost.

It is preferable that the end face of the optical fiber 35 is polished diagonally with respect to a light emission direction so as to prevent the reflected return light on the end face of the optical fiber 35 from being input again into the semiconductor laser apparatus 31. By polishing the end face of the optical fiber 35 diagonally, the light reflected by the end face of the optical fiber 35 travels diagonally with respect to a laser beam emission direction and is not input again into the semiconductor laser apparatus 31.

Since the semiconductor laser apparatus shown in the first embodiment is modularized in the third embodiment, a scattering intensity ratio is not more than −13 dB or not more than −28 dB. It is, therefore, possible to incorporate into an optical fiber amplifier having optical loss of about 3 dB when it is of not more than −13 dB, and into an arbitrary optical fiber amplifier when it is of not more than −28 dB. It is thereby possible to suppress the occurrence of stimulated Brillouin scattering.

An optical fiber amplifier according to a fourth embodiment is explained. In the fourth embodiment, the semiconductor laser module shown in the third embodiment is applied to a Raman amplifier.

Figure 26:
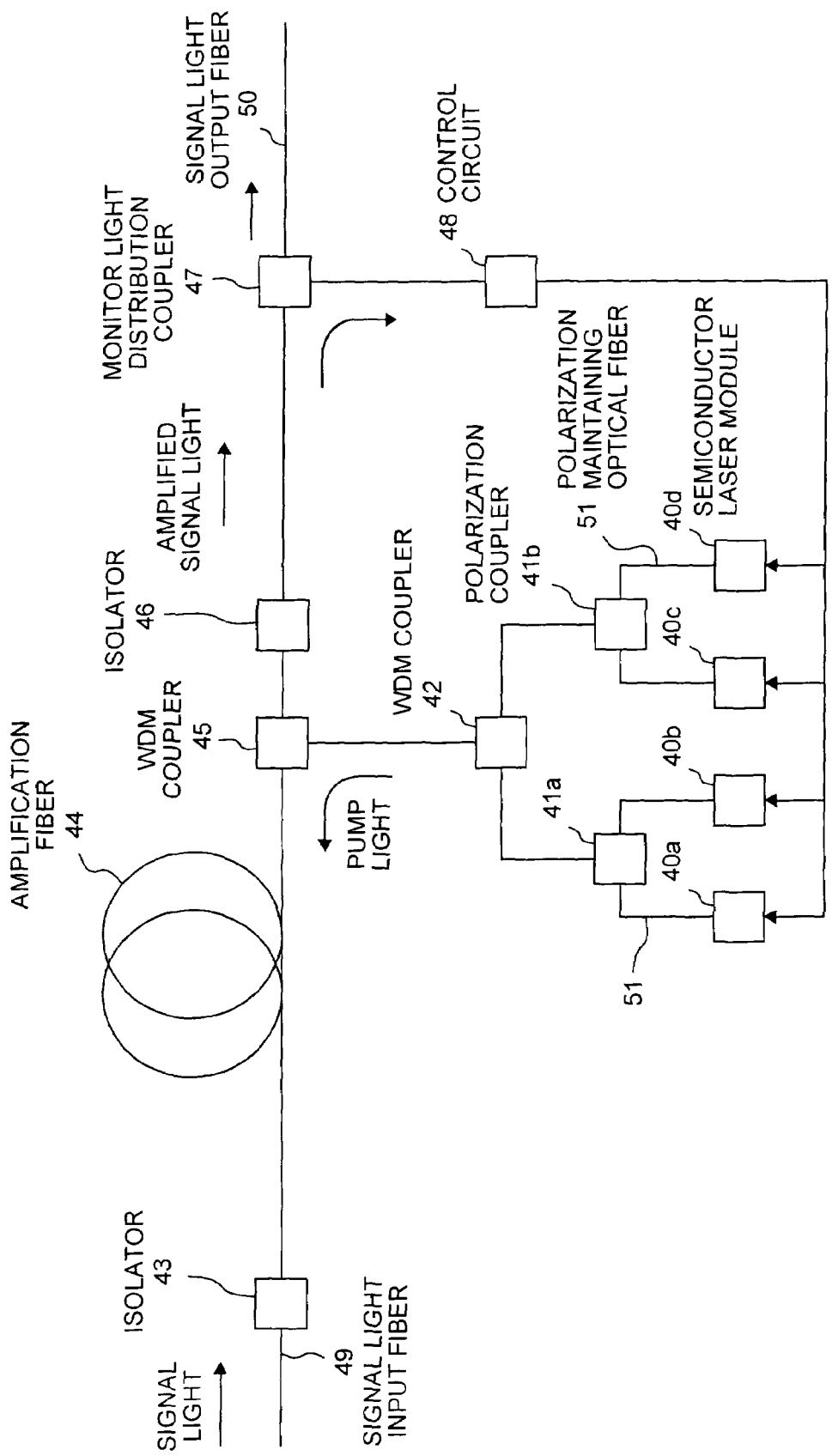
FIG. 26 is a block diagram that shows the configuration of an optical fiber amplifier according to a fourth embodiment.

FIG. 26 is a block diagram that shows the configuration of a Raman amplifier in the fourth embodiment. This Raman amplifier is used in a wavelength division multiplexing (WDM) communication system. In FIG. 26, this Raman amplifier is constituted to employ semiconductor laser modules 40a to 40d equal in configuration to the semiconductor laser module shown in the third embodiment.

Each of the semiconductor laser modules 40a and 40b outputs a laser beam having a plurality of oscillation longitudinal modes to a polarization coupler 41a through a polarization maintaining optical fiber 51, and each of the semiconductor laser modules 40c and 40d outputs a laser beam to a polarization coupler 41b through the polarization maintaining optical fiber 51. Laser beams emitted from the semiconductor laser modules 40a and 40b are equal in wavelength. In addition, laser beams emitted from the semiconductor laser modules 40c and 40d are equal in wavelength but different from those emitted from the laser modules 40a and 40b. This is because Raman amplification depends on polarization and, laser beams, the polarization dependencies of which are eliminated by the polarization couplers 41a and 41b, are output.

The laser beams different in wavelength and output from the respective polarization couplers 41a and 41b are combined by a WDM coupler 42, and the combined laser beam is output, as a pump light for Raman amplification, to an amplification fiber 44 through a WDM coupler 45. Signal light to be amplified is input into the amplification fiber 44 to which the pump light is input and the signal light is Raman-amplified.

The signal light (amplified signal light) Raman-amplified in the amplification fiber 44 is input into a monitor light distribution coupler 47 through the WDM coupler 45 and an isolator 46. The monitor light distribution coupler 47 outputs a part of the amplified signal light to a control circuit 48 and outputs the remaining amplified signal light to a signal light output fiber 50 as output light.

The control circuit 48 controls the laser output states of the respective semiconductor laser modules 40a to 40d, e.g., light intensities based on a part of the amplified signal light thus input, and conducts feedback control so that a Raman amplification gain band has flat characteristic.

The Raman amplifier shown in the fourth embodiment, employs the semiconductor laser module 40a that includes the semiconductor laser apparatus shown in the first embodiment. As explained above, since each of the semiconductor laser modules 40a to 40d has a plurality of oscillation longitudinal modes, it is possible to shorten the lengths of polarization maintaining optical fibers. As a result, it is possible to realize a small-sized, lightweight, and cost reduction of the Raman amplifier.

Figure 27:
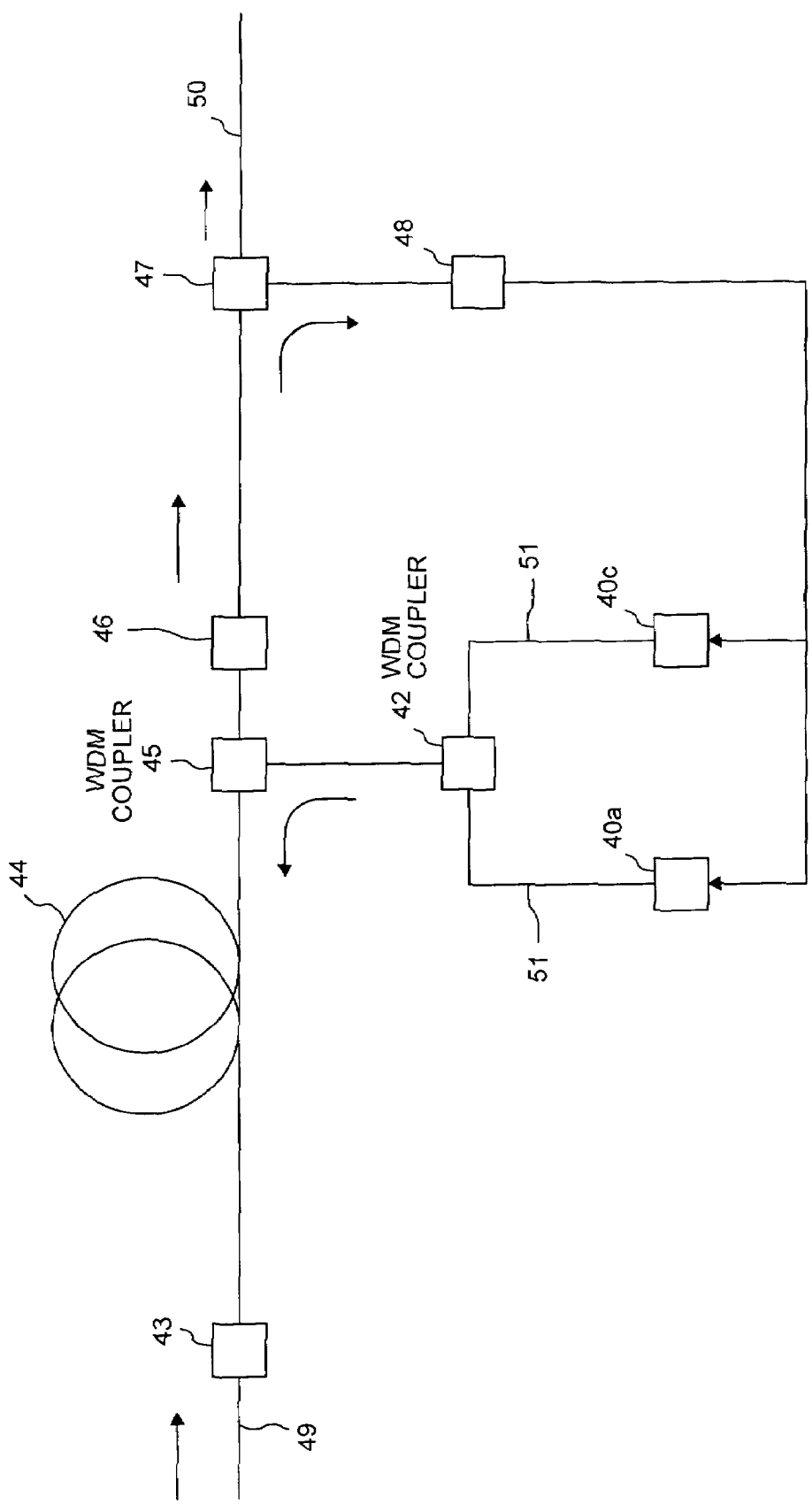
FIG. 27 is a block diagram that shows an applied example of the optical fiber amplifier according to the fourth embodiment.

While the Raman amplifier shown in FIG. 26 employs the polarization couplers 41a and 41b, light may be directly output to the WDM coupler 42 from the semiconductor laser modules 40*a* and 40*c* through polarization maintaining optical fibers 51, respectively, as shown in FIG. 27. In this case shown in FIG. 27, the light is incident so that the polarization planes of laser beams emitted from the semiconductor laser modules 40*a* and 40*c* form 45 degrees with respect to the polarization maintaining optical fibers 51, respectively. As explained above, since each of the semiconductor laser modules 40*a* and 40*c* has a plurality of oscillation longitudinal modes, it is possible to shorten the length of each polarization maintaining optical fiber 51. As a result, it is possible to eliminate the polarization dependency of the light output from the polarization maintaining optical fiber 51 and to realize a Raman amplifier smaller in size and smaller in the number of components.

When a semiconductor laser apparatus having many oscillation longitudinal modes is employed as the semiconductor laser apparatus included in each of the semiconductor laser modules 40*a* to 40*d*, it is possible to shorten the length of the necessary polarization maintaining optical fiber 51. When the number of oscillation longitudinal modes is four or five, in particular, the length of the necessary polarization maintaining optical fiber 51 is extremely short, so that the simplification and miniaturization of the Raman amplifier can be facilitated. When the number of oscillation longitudinal modes further increases, a coherent length decreases and the degree of polarization (DOP) becomes small by de-polarization, making it possible to eliminate the polarization dependency. It is thereby possible to further facilitate the simplification and miniaturization of the Raman amplifier.

The functions and advantages of the third embodiment can be furnished to the Raman amplifier. For example, it is possible to reduce the RIN compared with a semiconductor laser module that employs a fiber grating, so that low noise Raman amplification can be realized.

Since optical axis alignment in this Raman amplifier is easier than that in a semiconductor laser module that employs a fiber grating and there is no mechanically optical coupling in the resonator of the semiconductor laser module, it is possible to improve the stability and reliability of the Raman amplifier.

Additionally, the semiconductor laser apparatus according to the first embodiment has a scattering intensity ratio of not more than −13 dB or not more than −28 dB. It is, therefore, possible to completely suppress stimulated Brillouin scattering using the semiconductor laser apparatus having a scattering intensity ratio of not more than −13 dB when optical loss is about 3 dB in the fourth embodiment. In addition, even when optical loss hardly exists in the fourth embodiment, it is possible to completely suppress stimulated Brillouin scattering using the semiconductor laser apparatus having a scattering intensity ratio of not more than −28 dB.

The Raman amplifiers shown in FIG. 26 and FIG. 27 are backward pumping types. As explained above, since the semiconductor laser modules 40*a* to 40*d* output stable pump light, even the forward pumping type or a bidirectional pumping type can conduct stable Raman amplification.

Figure 28:
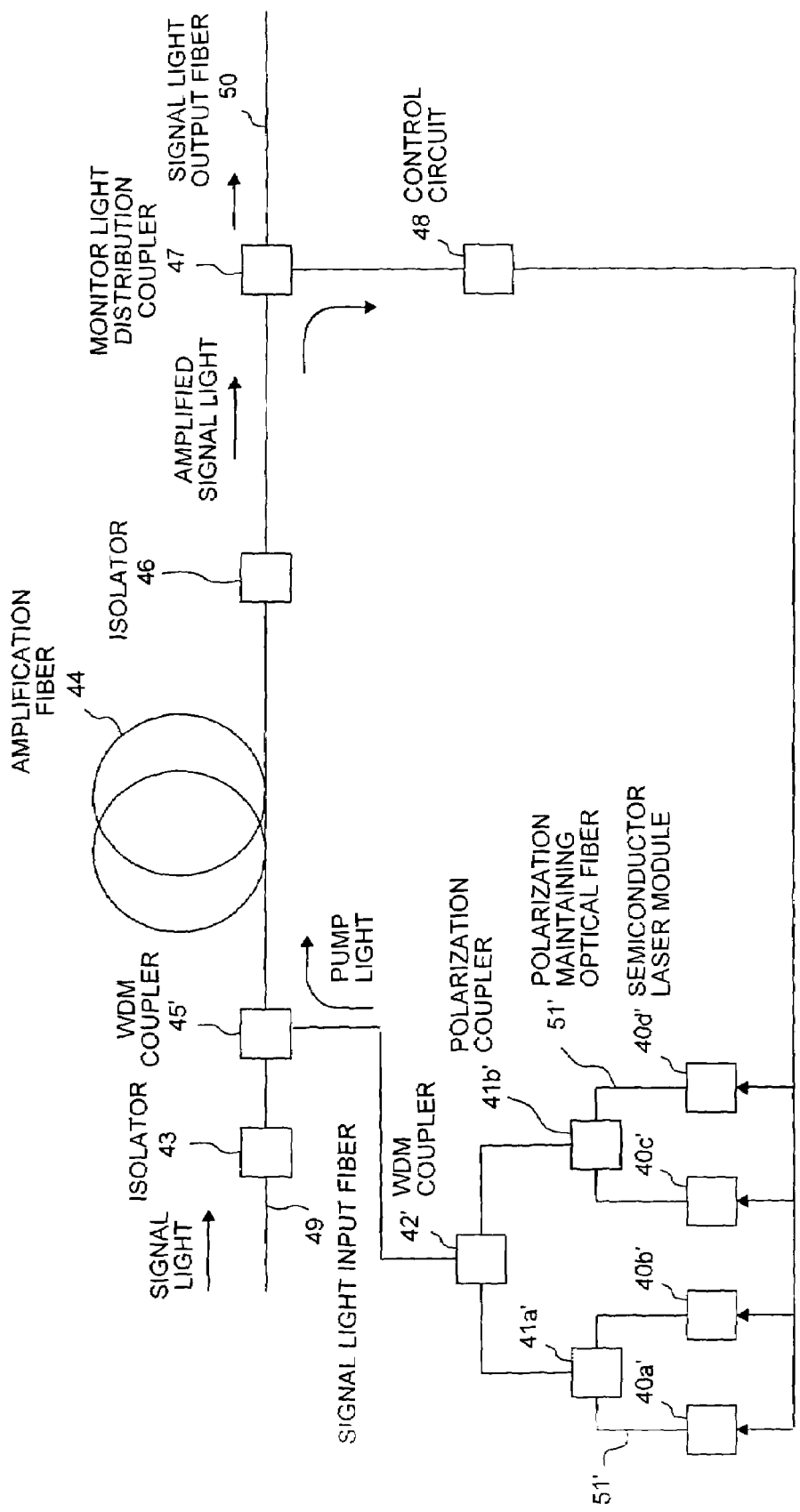
FIG. 28 is a block diagram that shows the configuration of an optical fiber amplifier that adopts a forward pumping method as a modification of the optical fiber amplifier according to the fourth embodiment.

By way of example, FIG. 28 is a block diagram that shows the configuration of a Raman amplifier of forward pumping type. The Raman amplifier shown in FIG. 28 is constituted so that a WDM coupler 45' is provided in the vicinity of the isolator 43 in the Raman amplifier shown in FIG. 26. To this WDM coupler 45', a circuit having semiconductor laser modules 40*a'* to 40*d'*, polarization couplers 41*a'* and 41*b'* and a WDM coupler 42' corresponding to the semiconductor laser modules 40*a* to 40*d*, the polarization couplers 41*a* and 41*b* and the WDM coupler 42, respectively, are connected, and the Raman amplifier conducts forward pumping for outputting pumped light output from the WDM coupler 42' in the same direction as that of signal light. In this forward pumping shown in FIG. 28, the semiconductor laser module used in the third embodiment is employed as each of the semiconductor laser modules 40*a'* to 40*d'*, so that low RIN can be realized and forward pumping can be effectively carried out.

Figure 29:
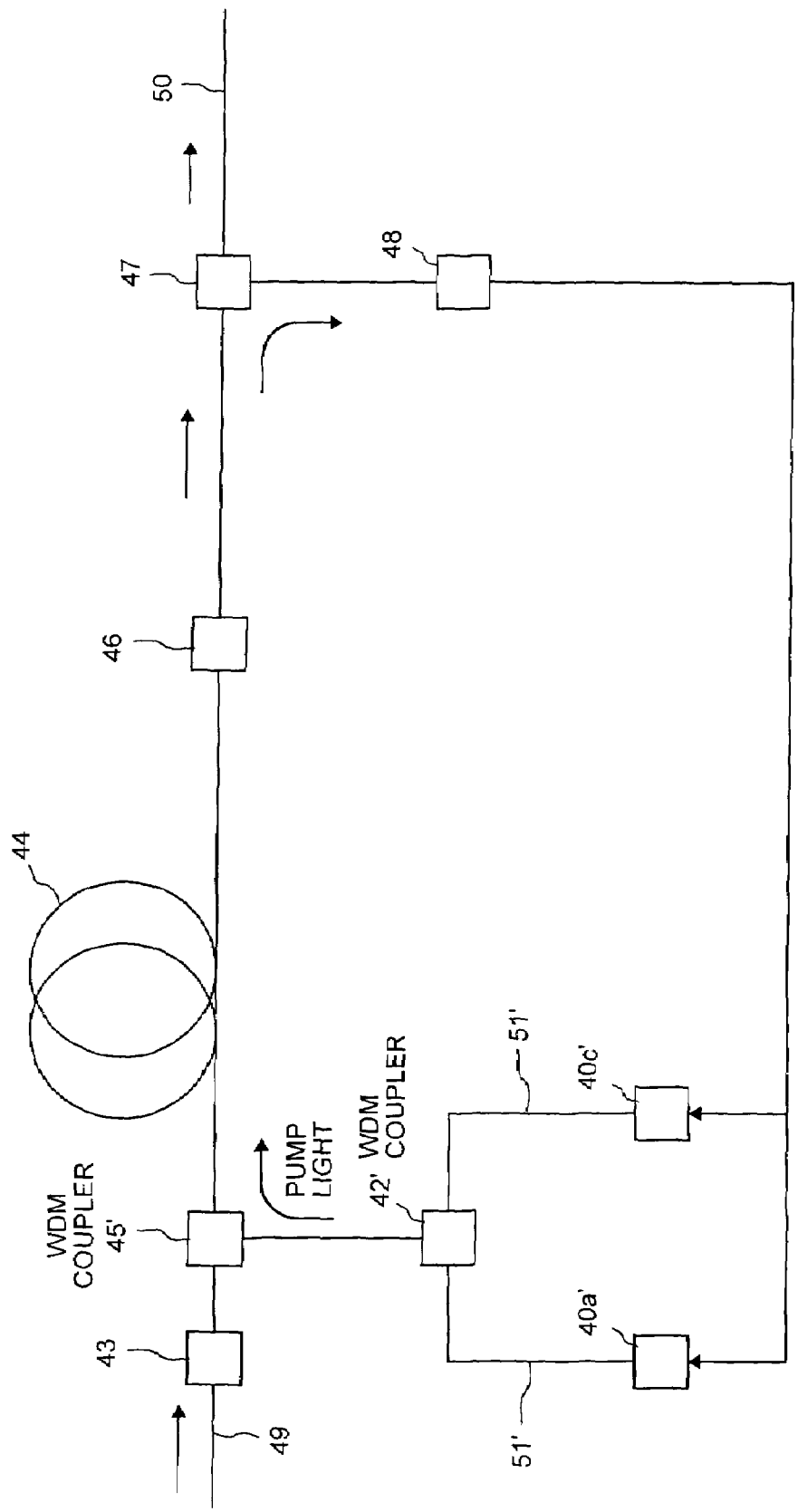
FIG. 29 is a block diagram that shows an applied example of the optical fiber amplifier shown in FIG. 28.

Likewise, FIG. 29 is a block diagram that shows the configuration of a Raman amplifier of forward pumping type. The Raman amplifier shown in FIG. 29 is constituted so that the WDM coupler 45' is provided in the vicinity of the isolator 43 in the Raman amplifier shown in FIG. 27. To this WDM coupler 45', a circuit having semiconductor laser modules 40*a'* and 40*c'* and a WDM coupler 42' corresponding to the semiconductor laser modules 40*a* and 40*c* and the WDM coupler 42, respectively, are connected, and the Raman amplifier conducts forward pumping for outputting pumped light output from the WDM coupler 42' in the same direction as that of signal light. In this forward pumping shown in FIG. 29, the semiconductor laser module used in the third embodiment is employed as each of the semiconductor laser modules 40*a'* and 40*c'*, so that low RIN can be realized and forward pumping can be effectively carried out.

Figure 30:
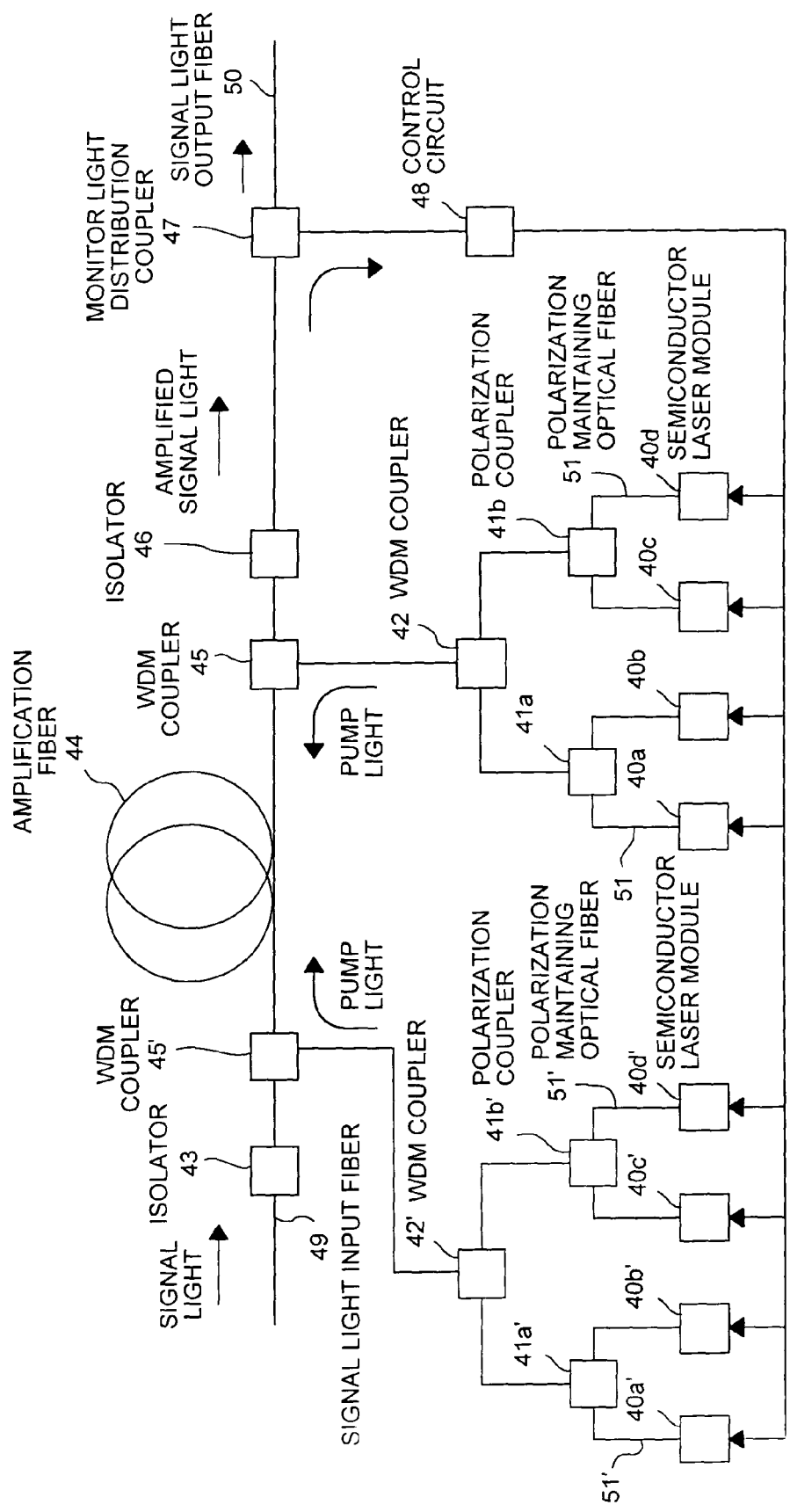
FIG. 30 is a block diagram that shows the configuration of an optical fiber amplifier that adopts a bidirectional pumping method as a modification of the optical fiber amplifier according to the fourth embodiment.

FIG. 30 is a block diagram that shows the configuration of a Raman amplifier of bidirectional pumping system. The Raman amplifier shown in FIG. 30 is constituted so that the WDM coupler 45', the semiconductor laser modules 40*a'* to 40*d'*, the polarization couplers 41*a'*, 41*b'*, and the WDM coupler 42' shown in FIG. 28 are added to the configuration of the Raman amplifier shown in FIG. 26, and conducts backward pumping and forward pumping. In this bidirectional pumping shown in FIG. 30, the semiconductor module according to the third embodiment is used as each of the semiconductor modules 40*a'* to 40*d'*, so that low RIN can be realized and forward pumping can be effectively carried out.

Figure 31:
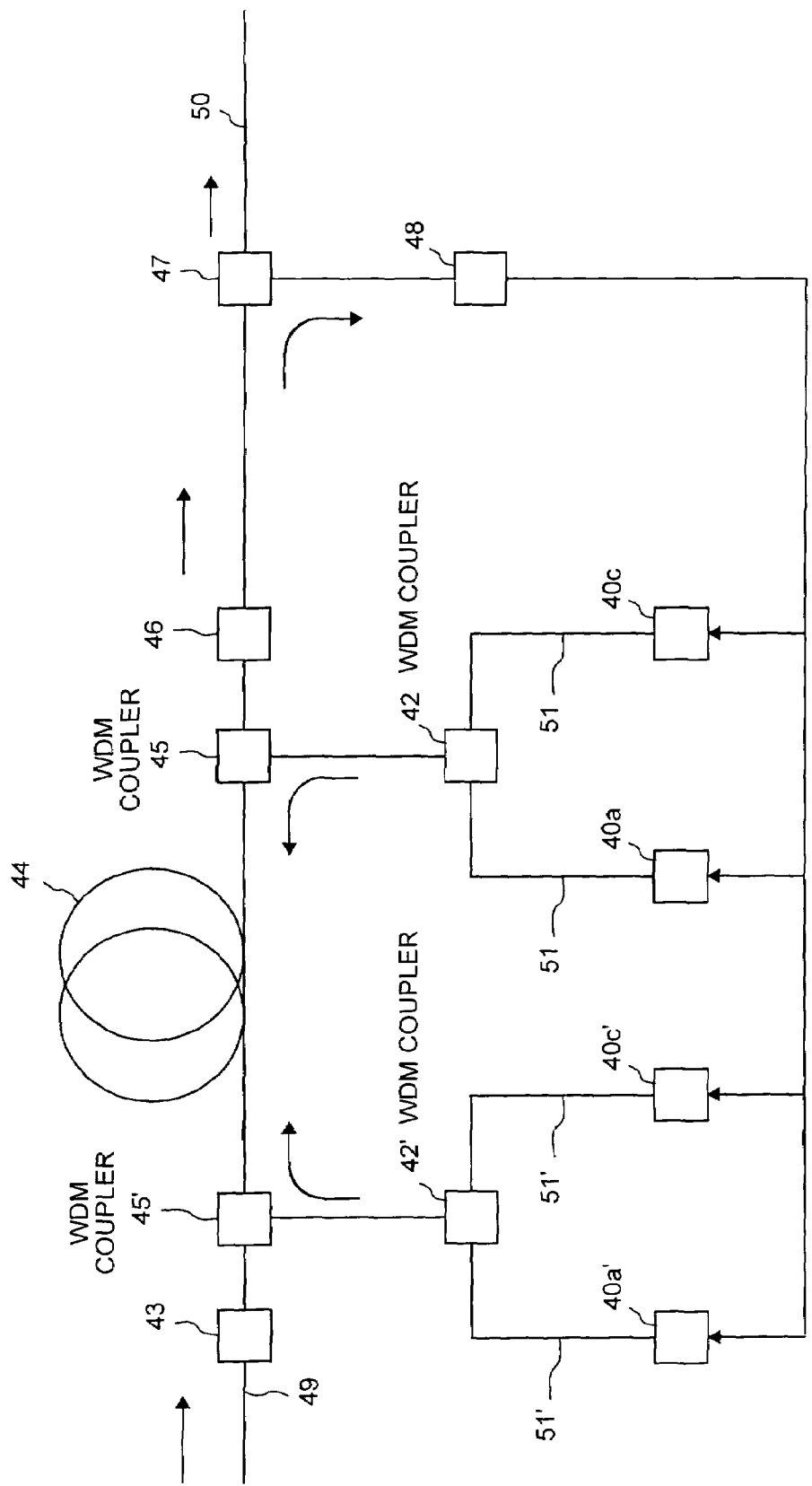
FIG. 31 is a block diagram that shows an applied example of the optical fiber amplifier shown in FIG. 30.

Likewise, FIG. 31 is a block diagram that shows the configuration of a Raman amplifier of bidirectional pumping type. The Raman amplifier shown in FIG. 31 is constituted so that the WDM coupler 45', the semiconductor laser modules 40*a'* to 40*d'*, and the WDM coupler 42' shown in FIG. 29 are added to the configuration of the Raman amplifier shown in FIG. 27, and conducts backward pumping and forward pumping. In this bidirectional pumping shown in FIG. 31, the semiconductor module according to the third embodiment is used as each of the semiconductor modules 40*a'* to 40*d'*, so that low RIN can be realized and forward pumping can be effectively carried out.

A Raman amplification pump source employed in the forward pumping or the forward pumping in the bidirectional pumping may have a resonator length L of less than 800 µm. When the resonator length L is less than 800 µm, the mode spacing Δλ between the oscillation longitudinal modes is narrowed and the number of oscillation longitudinal modes is decreased when the pump source is employed for Raman amplification as explained above, with the result that high power cannot be obtained. However, since the forward pumping requires relatively low power to the power of the backward pumping, it is not always necessary that the resonator length L is not less than 800 µm.

Figure 32:
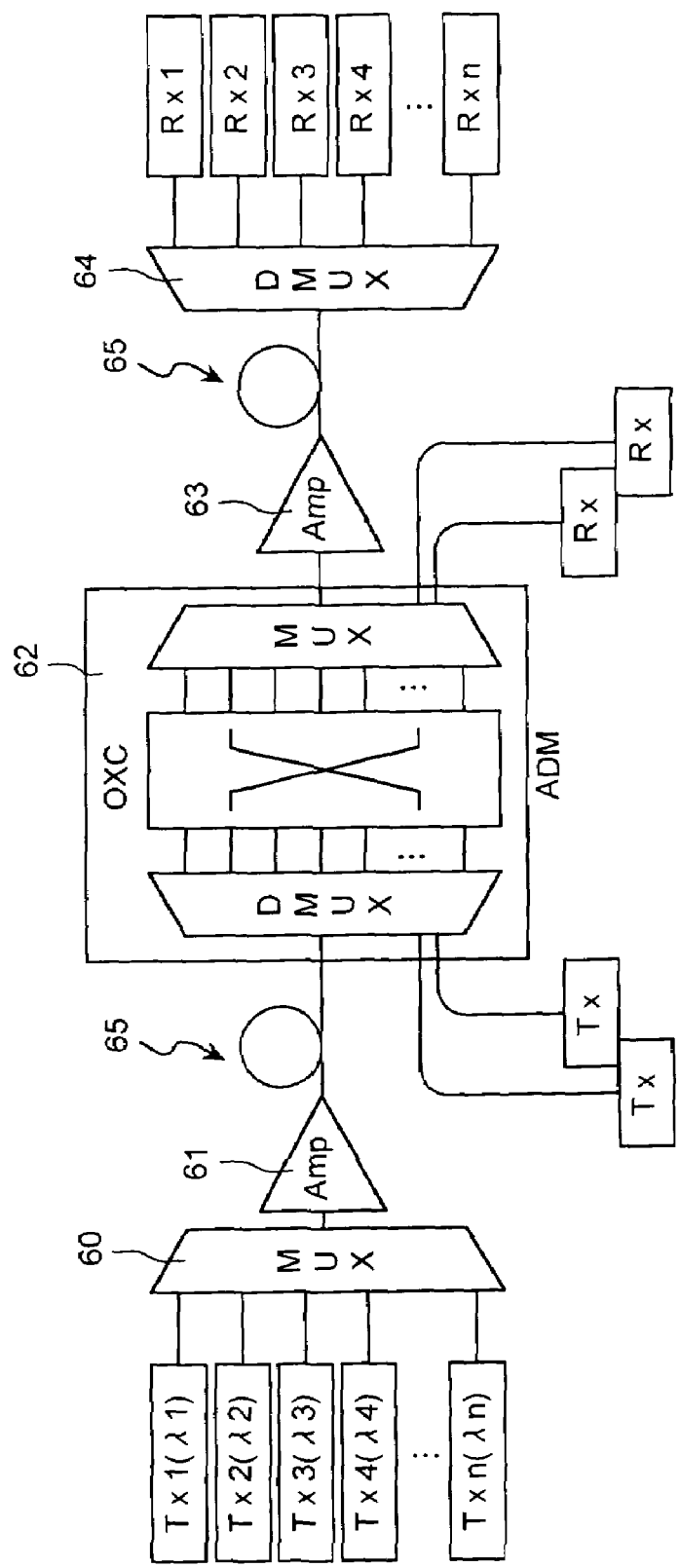
FIG. 32 is a block diagram that shows the schematic configuration of a WDM communication system using the optical fiber amplifier according to the fourth embodiment.

The Raman amplifiers shown in FIGS. 26 to 31 can be applied to a WDM communication system as explained above. FIG. 32 is a block diagram that shows the schematic configuration of a WDM communication system to which the Raman amplifiers shown in FIGS. 26 to 31 are applied.

In FIG. 32, light signals having wavelengths λ1 to λn transmitted from a plurality of transmitters Tx1 to Txn, respectively, are coupled by an optical multiplexer 60 and converged onto one optical fiber 65. A plurality of Raman amplifiers 61 and 63 corresponding to the Raman amplifiers shown in FIGS. 26 to 31 are arranged on the transmission path of this optical fiber 65 according to the distance of the transmission path and light signal attenuated is amplified. The signal transmitted on this optical fiber 65 is divided into a plurality of light signals having wavelengths λ1 to λn by an optical demultiplexer 64 and received by a plurality of receivers Rx1 to Rxn, respectively. An add/drop multiplexer (ADM) that adds and drops a light signal of an arbitrary wavelength is sometimes provided on the optical fiber 65.

In the fourth embodiment, a case in which the semiconductor laser apparatus shown in the first embodiment or the semiconductor laser module shown in the third embodiment is employed as a pump source for Raman amplification. However, it is not limited thereto. It is obvious that they can be used as a pump source for an EDFA of, for example, 0.98 μm. With an EDFA that has a transmission distance to the EDF of pump light that is several kilometers to tens of kilometers, in particular, employing the semiconductor laser apparatus according to the first embodiment as a pump source, makes it possible to effectively suppress the deterioration of amplification gain caused by stimulated Brillouin scattering during the transmission.

As explained so far, according to the embodiments, it is constituted so that the number of oscillation longitudinal modes, the difference values of which in optical intensity from the oscillation longitudinal mode having the highest optical intensity are not more than 10 dB, is not less than a predetermined number. Therefore, it is advantageously possible to suppress stimulated Brillouin scattering and it is advantageously possible to completely suppress stimulated Brillouin scattering when the semiconductor laser apparatus is used in combination with an optical fiber amplifier or the like.

According to the embodiments, the RMS method-based spectrum width of the emission wavelength spectrum is not less than a predetermined value. Therefore, it is advantageously possible to suppress stimulated Brillouin scattering and it is advantageously possible to completely suppress stimulated Brillouin scattering when the semiconductor laser apparatus is used in combination with an optical fiber amplifier or the like.

According to the embodiments, the number of oscillation longitudinal modes, the difference values of which in optical intensity from the oscillation longitudinal mode having the highest optical intensity are not more than 10 dB correlates to the occurrence of stimulated Brillouin scattering. Therefore, by measuring the number of the oscillation longitudinal modes, it is advantageously possible to sort the usage of the semiconductor laser apparatus that does not cause stimulated Brillouin scattering.

According to the embodiments, the RMS method-based spectrum width of the emission wavelength spectrum correlates to the occurrence of stimulated Brillouin scattering. Therefore, by measuring the RMS method-based spectrum width of the emission wavelength spectrum, it is advantageously possible to sort the usage of the semiconductor laser apparatus that does not cause stimulated Brillouin scattering.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor laser apparatus comprising:
   a first reflecting film provided on an emission end face of a laser beam;
   an active layer formed between the first reflecting film and a second reflecting film provided on a reflection end face of the laser beam; and
   a diffraction grating configured to emit the laser beam having a plurality of oscillation longitudinal modes, said diffraction grating selecting light, wherein the number of oscillation longitudinal modes is determined based on the total intensity of the laser beam and an effective cross section of an optical fiber when the laser beam is transmitted using the optical fiber when the differential values between the intensity of the oscillation longitudinal modes and the intensity of longitudinal mode having the highest optical intensity are not more than 10 dB,
   wherein the diffraction grating has a diffraction grating length of not more than 300 um.

2. A semiconductor laser apparatus comprising:
   a first reflecting film provided on an emission end face of a laser beam;
   an active layer formed between the first reflecting film and a second reflecting film provided on a reflection end face of the laser beam; and
   a diffraction grating configured to emit the laser beam having a plurality of oscillation longitudinal modes, said diffraction grating selecting light, wherein the number of oscillation longitudinal modes is determined based on the total intensity of the laser beam and an effective cross section of an optical fiber when the laser beam is transmitted using the optical fiber when the differential values between the intensity of longitudinal modes and the intensity of longitudinal mode having the highest optical intensity are not more than 10 dB,
   wherein a diffraction grating length of the diffraction grating is not more than the value of (300/1300) times a length of a resonator formed by the first reflecting film and the second reflecting film.

3. A semiconductor laser apparatus comprising:
   a first reflecting film provided on an emission end face of a laser beam;
   an active layer formed between the first reflecting film and a second reflecting film provided on a reflection end face of the laser beam; and
   a diffraction grating configured to emit the laser beam having a plurality of oscillation longitudinal modes, said diffraction grating selecting light, wherein the number of oscillation longitudinal modes is determined based on the total intensity of the laser beam and an effective cross section of an optical fiber when the laser beam is transmitted using the optical fiber when the differential values between the intensity of longitudinal modes and the intensity of longitudinal mode having the highest optical intensity are not more than 10 dB.
   wherein a multiplication value between a coupling coefficient of the diffraction grating and the diffraction grating length is not more than 0.3.

* * * * *